(12) United States Patent
Lee et al.

(10) Patent No.: US 11,923,000 B2
(45) Date of Patent: Mar. 5, 2024

(54) DATA SCRAMBLING METHOD THAT CONTROLS CODE DENSITY

(71) Applicant: UNIVERSITY OF SEOUL INDUSTRY COOPERATION FOUNDATION, Seoul (KR)

(72) Inventors: Dong Hee Lee, Seoul (KR); Choul Seung Hyun, Uijeongbu-si (KR); Gwan Il Jeong, Seoul (KR); Soo Won You, Seoul (KR)

(73) Assignee: UNIVERSITY OF SEOUL INDUSTRY COOPERATION FOUNDATION, Seoul (KR)

( * ) Notice: Subject to any disclaimer, the term of this patent is extended or adjusted under 35 U.S.C. 154(b) by 239 days.

(21) Appl. No.: 17/535,255

(22) Filed: Nov. 24, 2021

(65) Prior Publication Data

US 2022/0215874 A1 Jul. 7, 2022

(30) Foreign Application Priority Data

Jan. 4, 2021 (KR) .................. 10-2021-0000393

(51) Int. Cl.
*H03M 13/00* (2006.01)
*G11C 11/56* (2006.01)
*G11C 29/18* (2006.01)
*G11C 29/42* (2006.01)
*H03M 13/39* (2006.01)

(52) U.S. Cl.
CPC ...... *G11C 11/5628* (2013.01); *G11C 11/5642* (2013.01); *G11C 29/18* (2013.01); *G11C 29/42* (2013.01); *H03M 13/3933* (2013.01)

(58) Field of Classification Search
CPC ..... G11C 11/5648; G11C 29/18; G11C 29/42; H03M 13/3933
See application file for complete search history.

(56) References Cited

U.S. PATENT DOCUMENTS 7,131,010 B2 * 10/2006 Okaue .............. G11B 20/00507
380/284
8,831,040 B2 * 9/2014 Nakajima ............. H04L 1/0072
370/503

(Continued)

FOREIGN PATENT DOCUMENTS

KR 1020090118060 A 11/2009

*Primary Examiner* — Esaw T Abraham
(74) *Attorney, Agent, or Firm* — NKL LAW; Jae Youn Kim

(57) ABSTRACT

A data scrambling method for controlling a code density according to an exemplary embodiment of the present disclosure includes receiving a plain code which is a code to be stored in the non-volatile memory device and a storage address at which the plain code is recorded; determining a rank corresponding to the plain code, using an ET table including appearance frequency rank information corresponding to individual plain code; calculating an adjustment rank corresponding to the plain code, using the rank and a random number that is generated based on the address of storage address; determining a cipher code corresponding to the appearance frequency rank of the plain code, using the adjustment rank and an ECC table including rank information determined by an objective function for individual cipher code; and storing the cipher code in the storage address.

10 Claims, 25 Drawing Sheets

(56) References Cited

U.S. PATENT DOCUMENTS

| | | | |
|---|---|---|---|
| 9,021,336 B1* | 4/2015 | Northcott | G06F 11/1012 714/763 |
| 9,379,846 B1* | 6/2016 | Poplack | H04L 1/0041 |
| 11,658,685 B2* | 5/2023 | Chung | G06F 11/1048 714/764 |
| 2012/0297271 A1 | 11/2012 | Sommer et al. | |

* cited by examiner

```
int Encode(addr, code) {
    rank = ET[code];
    wh_index = rank_to_index(rank);
    s = shift(addr);
    wh_index = rotate(256, wh_index+s);
    cipher_code = ECC[ WH[wh_index] ];
    rank_up(code);
    return cipher_code;
} int Decode(addr, code) {
    rank = DT[code];
    wh_index = rank_to_index(rank);
    s = shift(addr);
    wh_index = rotate(256, wh_index-2);
    plain_code = DCC[ WH[wh_index] ];
    rank_up(plain_code);
    return plain_code;
}
```

FIG. 10

```
int Encode(addr, data) {
  ...
  hret = Eval_HIST();

if (hret == 0)
     s = shift_0();
  else if (hret == 1)
     s = shift_1();
  else if (hret == 2)
     s = shift_2();
  else if (hret == 3)
     s = shift_1();
  else s = shift_0();
  ...
}
```

```
shift_0() {
  ret f();
}
```

```
shift_1() {
  ret g();
}
```

```
shift_2() {
  ret h();
}
```

```
int Encode(addr, code) {
    rank = Search_Index_With_Code(ASM, code);
    wh_index = rank_to_index(rank);
    s = shift(addr);
    wh_index = rotate(256, wh_index+s);
    return ECC[ WH[wh_index] ];
} int Decode(addr, code) {
    rank = DT[code];
    wh_index = rank_to_index(rank);
    s = shift(addr);
    wh_index = rotate(256, wh_index-2);
    return Search_Code_With_Index(ASM, WH[wh_index] );
}
```

FIG. 17

ASM [255]

DATA SCRAMBLING METHOD THAT CONTROLS CODE DENSITY

CROSS-REFERENCE TO RELATED APPLICATIONS

This application claims priority to Korean Patent Application No. 10-2021-0000393 filed on Jan. 4, 2021, in the Korean Intellectual Property Office, the disclosure of which is incorporated herein by reference.

BACKGROUND

Field

The present disclosure relates to a memory device based on a non-volatile memory and a management method of the same.

Description of the Related Art

As a device for storing data, there are a volatile memory and a non-volatile memory. When the power is turned off, data in the volatile memory is erased while data in the non-volatile memory is maintained. Examples of the non-volatile memory include an MRAM and a PRAM and a flash memory. Specifically, the flash memory is widely used as a data storage device.

The non-volatile memories have different times and energy consumptions for read and write operations. Also, they have limited lifetimes. For example, there exists maximum number of Program/Erase (P/E) cycles in the flash memory. Furthermore, performance, reliability, endurance, and energy consumption may vary according to data patterns written to the non-volatile memory. To extend the lifespan of the non-volatile memory, techniques for minimizing bit flipping have been studied. Here, the number of bit flips may be defined as a programming distance, which is abbreviated as PD.

The non-volatile memory device, such as the flash memory, is a semiconductor memory device which can read, write, and erase data electrically. Also, it can maintain data after the power is turned off. To record new data to the non-volatile memory, an erase operation may need to be performed. Then, a write (or program) operation may be performed.

The erase operation may be performed in the unit of blocks and the program operation may be performed in the unit of pages.

A single-level cell (SLC) flash memory stores one bit per cell. A cell in the SLC flash memory may have two states, namely S0 and S1. And a logical value '1' may be assigned to the state S0 and a logical value '0' may be assigned to the state S1. After the erase operation, the state of a cell may be S0 and be considered to have the logical value '1'. At this state, we may program (or write) bit '1' or bit '0' to the cell. If we write bit '1', the cell state remains S0 and, at this time, the programming distance (PD) may be defined as 0. If we write bit '0', the cell state may change to S1 and, at this time, PD may be defined as 1.

A multi-level cell (MLC) flash memory stores two bits per cell. A cell in the MLC flash memory may have four states, namely S0, S1, S2, and S3. And logical two-bit values of "11", "10", "00", and "01" may be assigned to states S0-S3, respectively. After the erase operation, the state of a cell may be S0 and be considered to have the logical value "11". At this state, we may program (write) logical values of "11", "10", "00" or "01". If we program "11", the cell state remains S0 and, at this time, PD may be defined as 0. If we program "01", the cell state changed to S3 and, at this time, PD may be defined as 3.

A triple-level cell (TLC) flash memory stores three bits per cell and a cell in the TLC flash memory may have eight states such as S0~S7. And logical three-bit values of "111", "110", "100", "101", "001", "000", "010", and "011" may be assigned to states S0~S7, respectively. Also, PD may be defined as the distance of a cell state between before and after program operations.

A quad-level cell (QLC) flash memory stores four bits per cell and a cell in the QLC flash memory may have 16 states such as S0~S15. And logical four-bit values of "1111", "1110", "1100", "1101", . . . , and "0111" may be assigned to states S0~S15, respectively. Also, PD may be defined as the distance of a cell state between before and after program operations.

Like this, PD may be calculated from cell data programmed in the non-volatile memory. And performance, reliability, endurance, and energy consumption may vary according to the PD. To minimize the PD, a 1-to-1 translation method may be used to translate a frequently-occurring bit pattern (code) to a bit pattern (code) with smaller PD and a rarely-occurring bit pattern (code) to a bit pattern (code) with higher PD. In the present disclosure, the original bit pattern is referred to as "plain code" and the translated bit pattern is referred to as "cipher code". Then, the 1-to-1 translation method converts a specific "plain code" to a predetermined "cipher code" statically. And the "cipher code" is converted to the "plain code" when it is read from the non-volatile memory. Like this, the 1-to-1 translation method may reduce the PD. However, the 1-to-1 translation method is not regarded as a data scrambling method for the reason described below.

Minimizing the PD may not be the only target and another target may be making the PD close to a specific value. In QLC flash memory, for example, cells may have 16 states, namely, 0~15, and the target may be making the average cell states close to 7.5, which is the median value. In this case, the target function may be defined as making the average PD close to 7.5. It should be noted that the target function is not limited to making PD close to the median value. Rather, there may be various target functions deciding target values based on requirements.

When data is programmed, data scrambling may be applied. Like 1-to-1 translation method, the data scrambling converts a "plain-code" to a "cipher code". However, unlike the 1-to-1 translation, the data scrambling converts a specific "plain code" to a different "plain code" at each time. Thus, the data-scrambling is regarded as 1-to-n translation method. If the data scrambling is used at program time, the data descrambling is needed at read time to convert a cipher code to a plain code.

Scrambling techniques of the art aim to generate pure-random cipher codes. In contrast, the aim of present disclosure is generating some cipher codes more than the others and this technique is referred to as "data scrambling with different code densities". By generating cipher codes with different densities, states of memory cells can be controlled. Through controlling cell states, the technique of the present disclosure may improve performance, reliability, endurance, and energy consumption of the non-volatile memory device.

SUMMARY

An objective of the present disclosure is to provide a data scrambling method which controls code densities by generating some codes more than the others and, thus, controls cell states of non-volatile memory when data is recorded to a non-volatile memory device.

In order to achieve the above-described objectives, according to an aspect of the present disclosure, a data scrambling method for controlling code densities includes: receiving a plain code which is a code to be stored in the non-volatile memory device and a storage address at which the plain code is recorded; determining a rank corresponding to the plain code, using an ET table including appearance frequency rank information corresponding to individual plain code; calculating an adjustment rank corresponding to the plain code, using the rank and a random number that is generated based on the address of storage address; determining a cipher code corresponding to the appearance frequency rank of the plain code, using the adjustment rank and an ECC table including rank information determined by an objective function for individual cipher code; and storing the cipher code in the storage address.

Desirably, in the determining of a cipher code corresponding to the appearance frequency rank of the plain code, when the adjustment rank is out of index range of the ECC table, the adjustment rank is rearranged within the index range of the ECC table.

Desirably, determination of a cipher code corresponding to the appearance frequency rank of the plain code further uses an EW table which has a circular shape and is constructed from the ECC table such that the corresponding rank increases as the index of the EW table increases until half of the entire index and then the corresponding rank decreases as the index of the EW table increases.

Desirably, determination of a cipher code corresponding to the appearance frequency rank of the plain code further uses a WH table which has a circular shape and translates the appearance frequency rank information of the ET table to an index of the ECC table such that the corresponding rank of the ECC table increases as the index of the WH table increases until half of the entire index and then the corresponding rank of the ECC table decreases as the index of the WH table increases.

Desirably, a random number is determined using one of a plurality of non-uniform probability density functions in which 0 has the highest probability and other numbers have probabilities proportional to the distance from 0 and, the one of the plurality of non-uniform probability density functions is selected with information about cell states and, the cell state is conjectured from a history queue that collects recently translated plain and cipher codes.

Desirably, the data scrambling method may further include reconfiguring an appearance frequency rank of the ET table, and the reconfiguration of an appearance frequency rank of the ET table may include increasing the rank of a recently translated plain code by a predetermined step value in the ET table.

Desirably, the data scrambling method may further include reconfiguring an appearance frequency rank of the ET table, and the reconfiguration of an appearance frequency rank of the ET table may include increasing the rank of a recently translated plain code to the top in the ET table.

Desirably, in the calculating of the adjustment rank, the plain code is divided into a plurality of sub-plain-codes and an adjustment rank corresponding to each of the plurality of sub-plain-codes is calculated using an ET table corresponding to each of the plurality of sub-plain-codes and the random number, in the determining of a cipher code, a plurality of sub-cipher-codes corresponding to an appearance frequency rank of the plurality of sub-plain-codes is determined using the adjustment rank and the ECC table including information of the sub-cipher-codes corresponding to the appearance frequency rank of the plurality of sub-plain-codes and the plurality of sub-cipher-codes is combined to determine the cipher code, and the calculating of the adjustment rank and the determining of the cipher code operate in parallel for the plurality of sub-plain-codes.

Desirably, when a programming distance (PD) is defined by an objective function which digitizes the closeness to a target for individual cipher code in accordance with a predetermined criterion, the ECC table may match a cipher code with a rank induced from the appearance frequency of the individual plain code.

Further, in order to achieve the above-described objectives, according to another aspect of the present disclosure, a data descrambling method, which performs descrambling on data scrambled in accordance with the data scrambling method according to the aspect of the present disclosure, includes: receiving a read address from which a plain code is read; reading a cipher code from the read address; calculating a rank corresponding to the cipher code, using a DT table including appearance frequency rank information of a plain code corresponding to individual cipher codes, using a random number to calculate adjustment rank; and acquiring a plain code from a DCC table including information of a plain code corresponding to an appearance frequency rank of an individual plain code.

BRIEF DESCRIPTION OF THE DRAWINGS

The above and other aspects, features and other advantages of the present disclosure will be more clearly understood from the following detailed description taken in conjunction with the accompanying drawings, in which:

FIG. 10 is a view for explaining scrambling and descrambling methods including dynamic reconfiguration in accordance with an exemplary embodiment of the present disclosure;

FIG. 17 is a view for explaining scrambling and descrambling methods using a table implemented with an associative memory;

DETAILED DESCRIPTION OF THE PREFERRED EMBODIMENT

Figure 1:
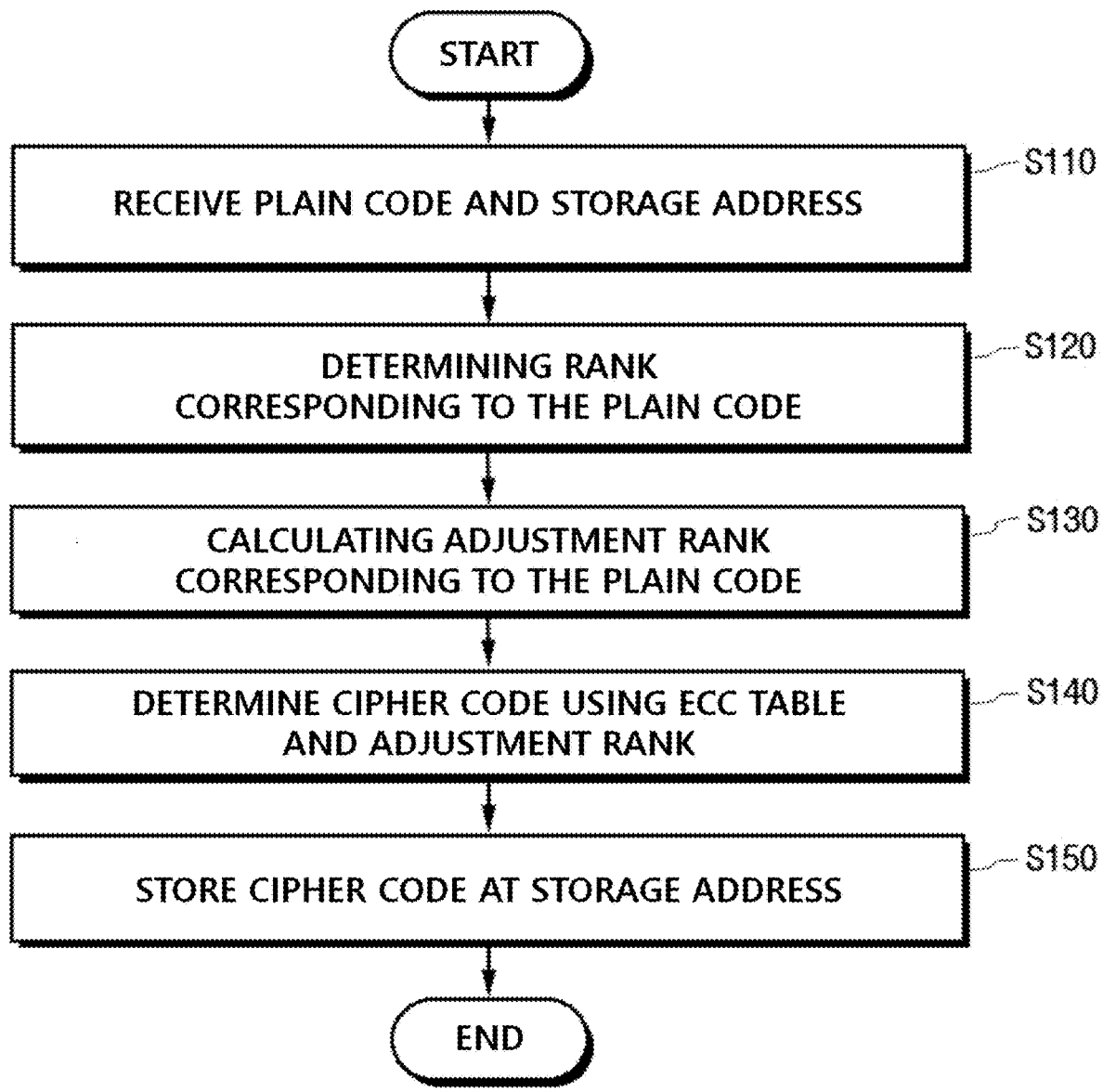
FIG. 1 is a flow chart illustrating a data scrambling method that controls code densities according to an exemplary embodiment of the present disclosure.

Those skilled in the art may make various modifications to the present disclosure and the present disclosure may have various embodiments thereof, and thus specific embodiments will be described in detail with reference to the drawings. It should be understood, however, that the present disclosure is not limited to the specific embodiments, but includes all changes, equivalents, or alternatives which are included in the spirit and technical scope of the present disclosure. In the description of respective drawings, similar reference numerals designate similar elements.

Though terms such as first, second, A, or B may be used to describe various components, the components are not limited by the above terms. The above terms are used only to discriminate one component from the other component. For example, without departing from the scope of the present disclosure, a first component may be referred to as a second component, and similarly, a second component may be referred to as a first component. A term of and/or includes combination of a plurality of related elements or any one of the pluralities of related elements.

Terms such as "coupled" and "connected" between elements should be understood to mean that the element may be directly coupled or directly connected to the other element or coupled or connected to the other element through a third element. In contrast, terms "directly coupled" and "directly connected" between elements should be understood to mean that no element is not present therebetween.

Terms used in the present application are used only to describe a specific exemplary embodiment, but they are not intended to limit the present disclosure. A singular form may include a plural form if there is no clearly opposite meaning in the context. In the present application, terms "include" and "have" should be understood to indicate that a feature, a number, a step, an operation, a component, a part or the combination those of described in the specification is present, but do not exclude a possibility of presence or addition of one or more other features, numbers, steps, operations, components, parts or combinations, in advance.

If it is not contrarily defined, all terms used herein including technological or scientific terms have the same meaning as those generally understood by a person with ordinary skill in the art. Terms defined in generally used dictionary shall be construed that they have meanings matching those in the context of a related art, and shall not be construed in ideal or excessively formal meanings unless they are clearly defined in the present application.

A data size used in the exemplary embodiment of the present disclosure is not limited to a specific value, and another size may also be used. Further, a table or a data structure may be configured with different size of data from the proposed size. Proposed techniques are not limited to a specific size of data but may also be operated with various size of data.

In the specification and the claim, unless explicitly described to the contrary, the word "comprise" and variations such as "comprises" or "comprising", will be understood to imply the inclusion of status elements but not the exclusion of any other elements.

In the exemplary embodiment of the present disclosure, encoding refers to a process of converting a plain code to a cipher code while performing scrambling or ciphering. Further, decoding refers to a process of converting a cipher code to a plain code while performing descrambling or deciphering. The terms scrambling and encoding may be used interchangeably in the sense of converting a plain code to a cipher code and the terms descrambling and decoding may be used interchangeably in the sense of converting a cipher code to a plain code.

Hereinafter, the present disclosure will be described in detail with reference to the accompanied drawings.

Each plain code has a rank determined by its appearance frequency and an ET table provides the rank information of plain codes. Also, each cipher code has a rank determined by an objective function and an DT table provides the rank information of cipher codes.

FIG. 1 is a flowchart for explaining an embodiment of a data scrambling method.

In step S110, a non-volatile memory device receives a plain code and a storage address at which the plain code is recorded (programmed).

Here, the plain code is a data code given for recording to non-volatile memory. However, the plain code may be converted to a cipher code by a scrambling method and, in fact, the cipher code may be recorded.

In step S120, the non-volatile memory device determines a rank corresponding to the plain code, using an ET table including appearance frequency rank information corresponding to individual plain code.

The non-volatile memory device obtains the rank of the plain code from the ET table.

In step S130, the non-volatile memory device calculates an adjustment rank with the rank and a random number.

Here, the random number is generated by a function and the adjustment rank refers to a rank that is newly calculated from the original rank (obtained from the ET table) and the random number.

In step S140, the non-volatile memory device determines a cipher code corresponding to the adjustment rank using an ECC table, which includes cipher codes in an order of the rank determined by an objective function.

Eventually, a plain code is converted to a cipher code through ET and ECC tables.

Finally, in step S150, the non-volatile memory device stores a cipher code at the address of the storage device.

Figure 2:
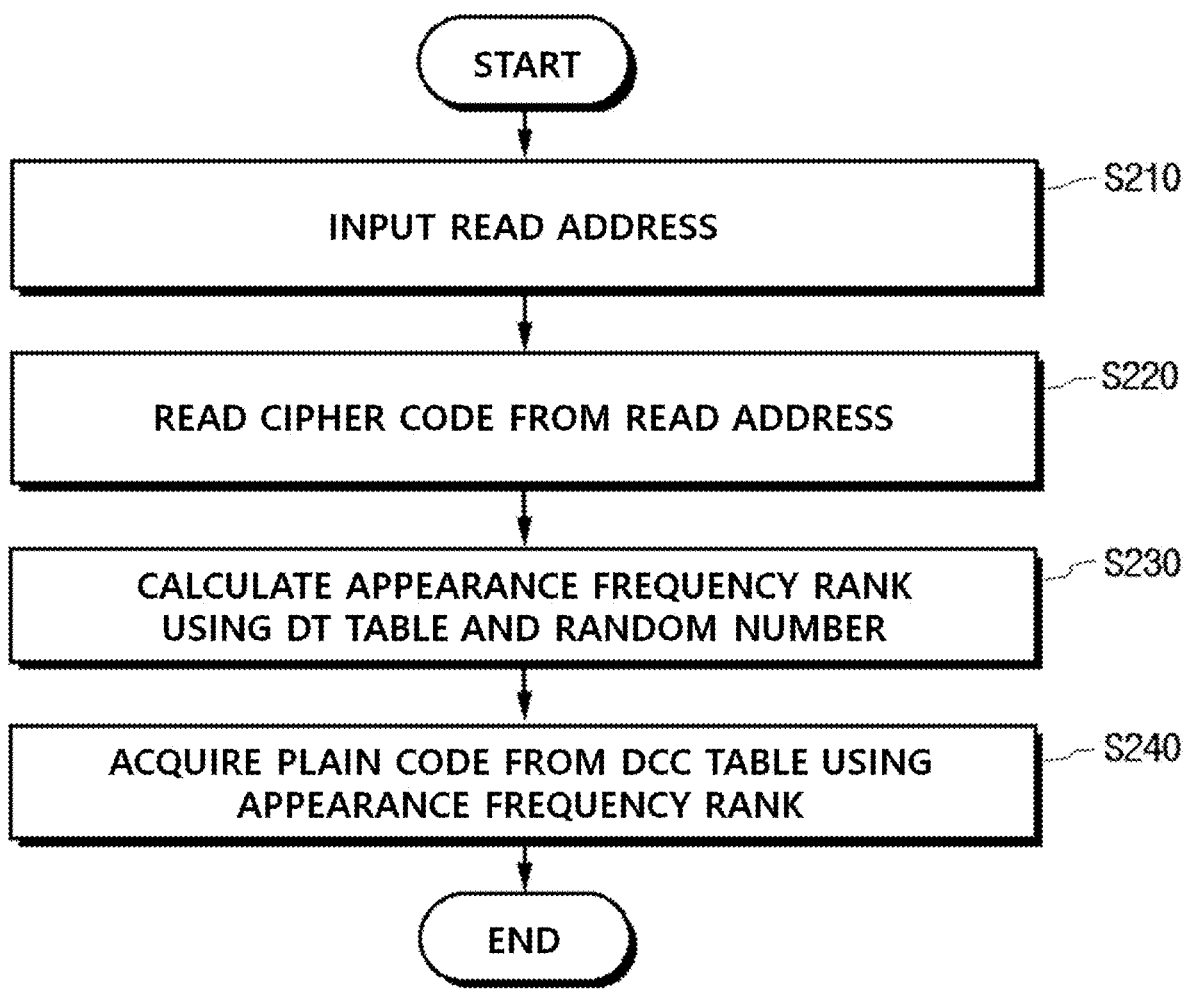
FIG. 2 is a flowchart illustrating a data descrambling method according to an exemplary embodiment of the present disclosure.

FIG. 2 is a flowchart for explaining an embodiment of a data descrambling method.

In step S210, the non-volatile memory device receives a read address from which a plain code is read.

For example, from an external device, the non-volatile memory device may receive a read address to read the plain code. In fact, however, a cipher code may be stored at the address of the non-volatile memory device.

In step S220, the non-volatile memory device reads the cipher code from the address.

In step S230, the non-volatile memory device may acquire the rank of the cipher code from the DT table.

Then the non-volatile memory device calculates an adjustment rank with the rank and a random number generated by a function.

Finally, in step S240, the non-volatile memory device acquires a plain code corresponding to the adjustment rank from a DCC table that includes plain codes in an order of the rank.

In the exemplary embodiment of the present disclosure, the rank represents the appearance frequency of a plain code.

Figure 3:
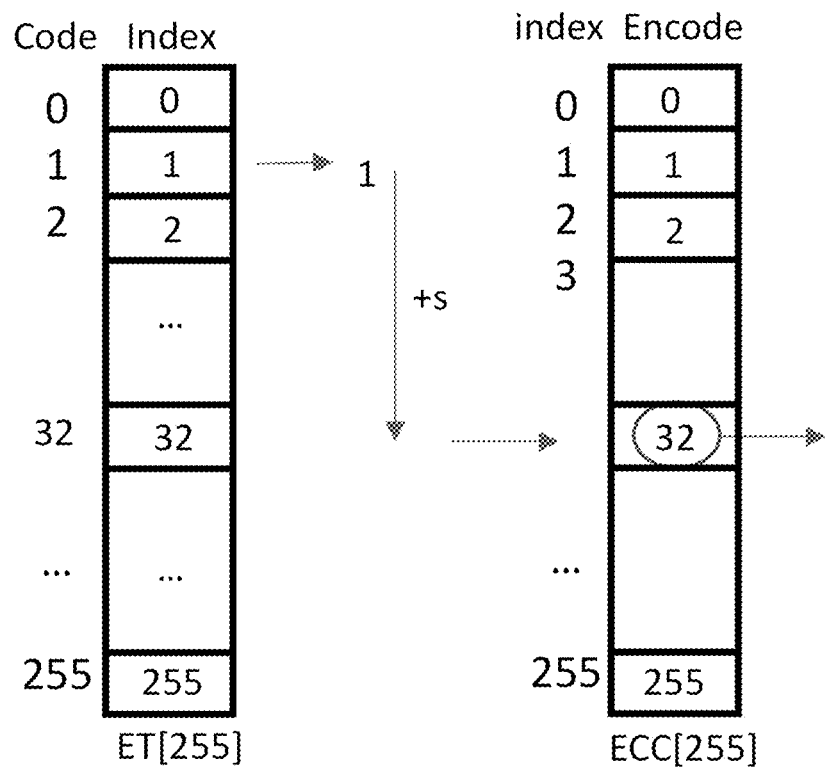
FIG. 3 is a view for explaining a data scrambling method.
Figure 4:
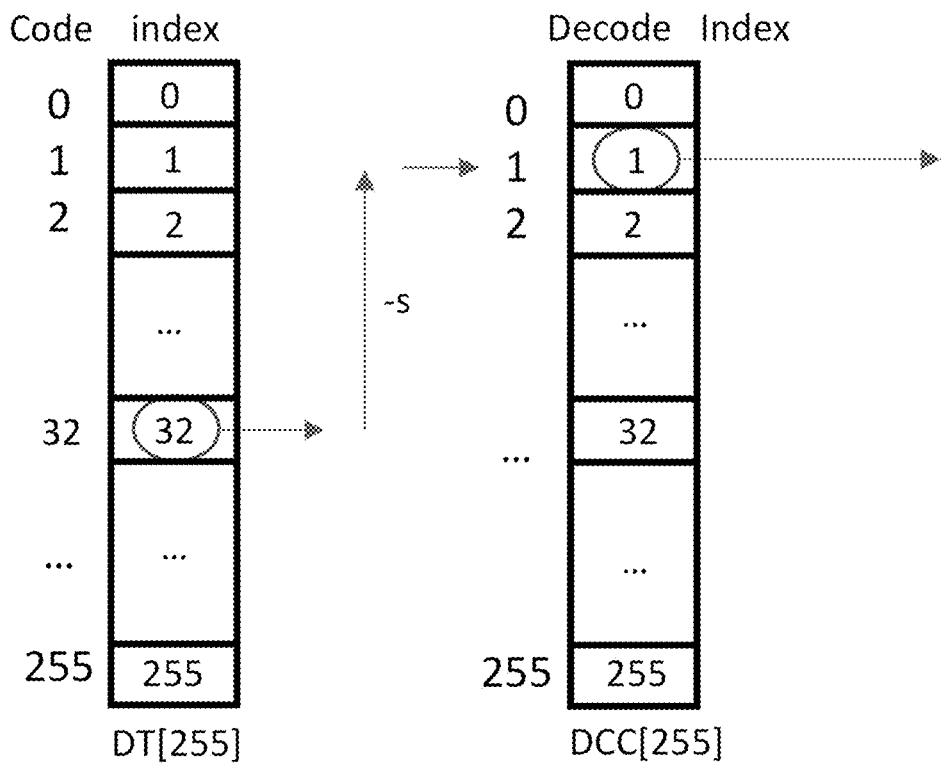
FIG. 4 is a view for explaining a data descrambling method.

By calculating the adjustment rank with a random number generated by the function shift(addr) as illustrated in FIGS. 3 and 4, a plain code may be converted to a different cipher code at each time. Thus, code conversion of the present disclosure is not the 1-to-1 translation method but a kind of data scrambling.

Unlike existing scrambling techniques of the art, which generate pure-random cipher codes, data scrambling of the present disclosure tries to control cipher code densities to meet specific objectives.

Controlling cipher code densities may be done through a combination of a source of non-uniformity, data structure connecting the non-uniformity to cipher codes, and a random number having non-uniform probability density. In the exemplary embodiment of present disclosure, appearance frequencies of plain codes are used as the source of non-uniformity. However, it is understood that the source of non-uniformity is not limited to the appearance frequencies and any kind of non-uniform property may be used as the source of non-uniformity.

An exemplary embodiment of the present disclosure, which controls cipher code densities, may use 1) different appearance frequencies of plain codes, 2) a table configuration connecting plain codes having different appearance frequencies to cipher codes having different PD values, and 3) a non-uniform probability density function for random number generation.

Figure 5:
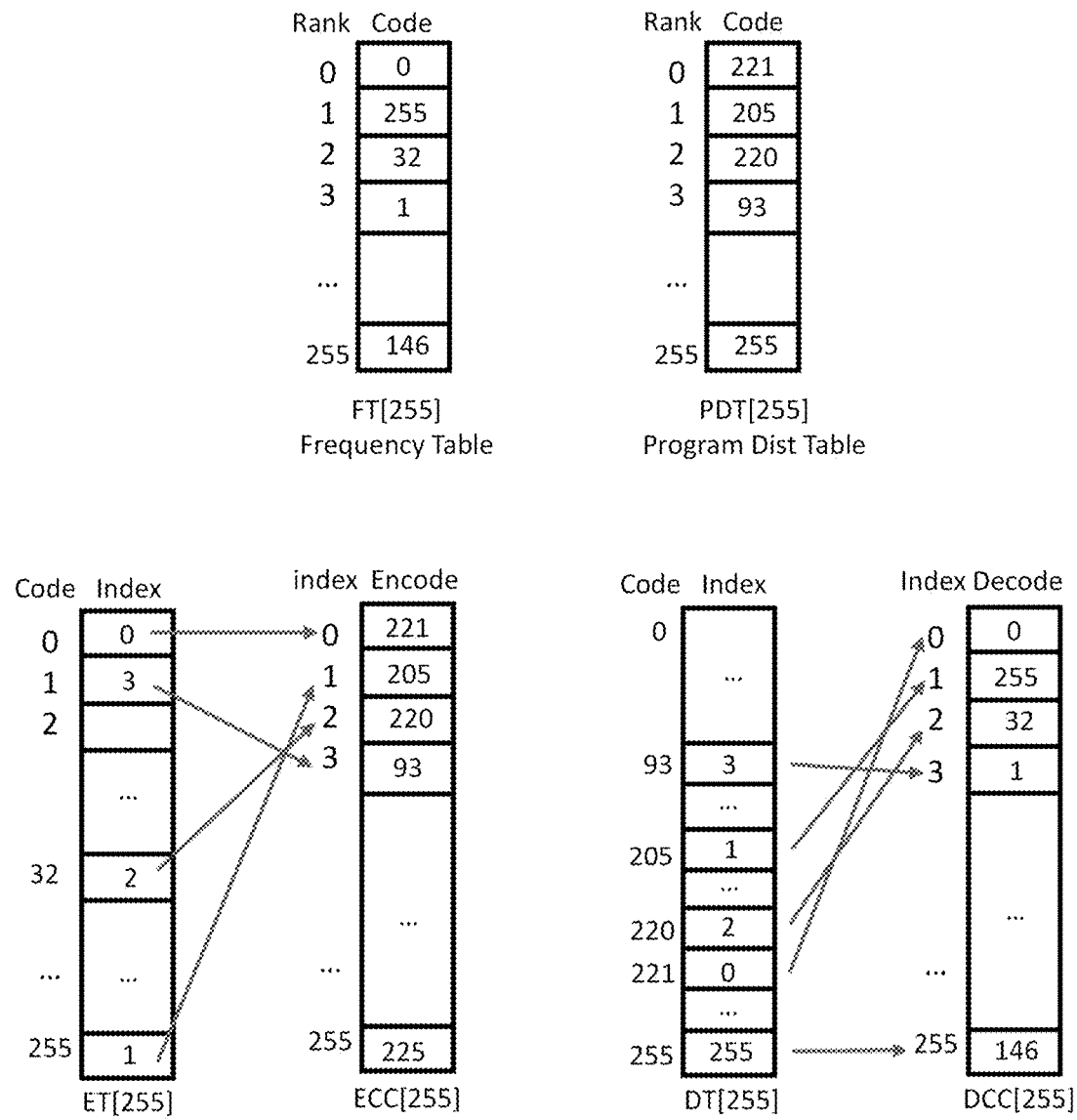
FIG. 5 is a view for tables used in a data scrambling method in accordance with an exemplary embodiment of the present disclosure.

FIG. 5 illustrates a configuration of tables according to an exemplary embodiment of the present disclosure. It is assumed that a rank is assigned to a plain code according to its appearance frequency. Also, it is assumed that a rank is assigned to a cipher code according to its PD value. In FIG. 5, the FT table provides the rank of a plain code and the PDT table provides the rank of a cipher code.

In FIG. 5, plain code 0 has the highest appearance frequency and plain code 255 has the next highest frequency. Thus, ranks 0 and 1 are assigned to plain codes 0 and 255, respectively, in the FT table.

In the PDT table, ranks 0, 1, 2 are assigned to cipher codes 221, 205, and 220, respectively, according to their PD values determined by an objective function.

ET, ECC, DT, and DCC tables for encoding and decoding may be built as illustrated in FIG. 5, using the FT and PDT tables. In detail, the DCC table is identical to the FT table and the ECC table is identical to the PDT table. The ET table may be built by swapping indexes and entry vales of the FT table. And the DT table may be built by swapping indexes and entry values of the PDT table.

It is understood that the rank relationship in tables is gradually formed in ascending or descending order.

In FIG. 5, there are 256 ranks from 0 to 255 in FT and DCC tables. And the ECC table has 256 ranks from 0 to 255. In the order, rank 0 and rank 1 are gradual, and rank 1 and rank 2 are gradual. However, rank 0 (the highest rank) and rank 255 (the lowest rank) are not gradual.

During encoding and decoding operations, the adjustment rank is used as a table index. If the adjustment rank is out of index range of a table, it is rearranged (rotated) within the index range.

For example, if the adjustment rank is a negative number smaller than 0, the non-volatile memory device may repeatedly add the number of indexes of the ECC table to the adjustment rank until the adjustment rank is equal to or larger than 0. To be more specific, if the adjustment rank is −100, the non-volatile memory device may change the adjustment rank to 156 by adding 256 to −100.

In other case, when the adjustment rank is equal to or larger than the number of indexes of the ECC table, the non-volatile memory device may repeatedly subtract the number of indexes from the adjustment rank until the adjustment rank is within the index range. For example, if the adjustment rank is 356, the non-volatile memory device may change the adjustment rank to 100 by subtracting 256 from 356. In the present disclosure, the rearrange of the adjustment rank is referred to as "rotation".

By the way, rank relationship may collapse by the rotation. For example, it is assumed that a code has rank 0 (the highest rank) and the adjustment rank is calculated by subtracting 1 from it. In this example, the adjustment rank is expected to be the second highest rank by subtracting 1 from it. After subtraction, the adjustment rank becomes −1. As the adjustment rank is out of index range, it is rotated by adding 256 (the number of indexes), resulting in the adjustment rank 255 (the lowest rank). Now, the adjustment rank becomes the lowest rank after the rotation and it is far below what it is expected to be. Like this, rank relationship may collapse by the rotation.

According to the exemplary embodiment of the present disclosure, to rotate while maintaining the meaning of the rank, the ECC and DCC tables may be reconfigured to have a circular shape.

Figure 6:
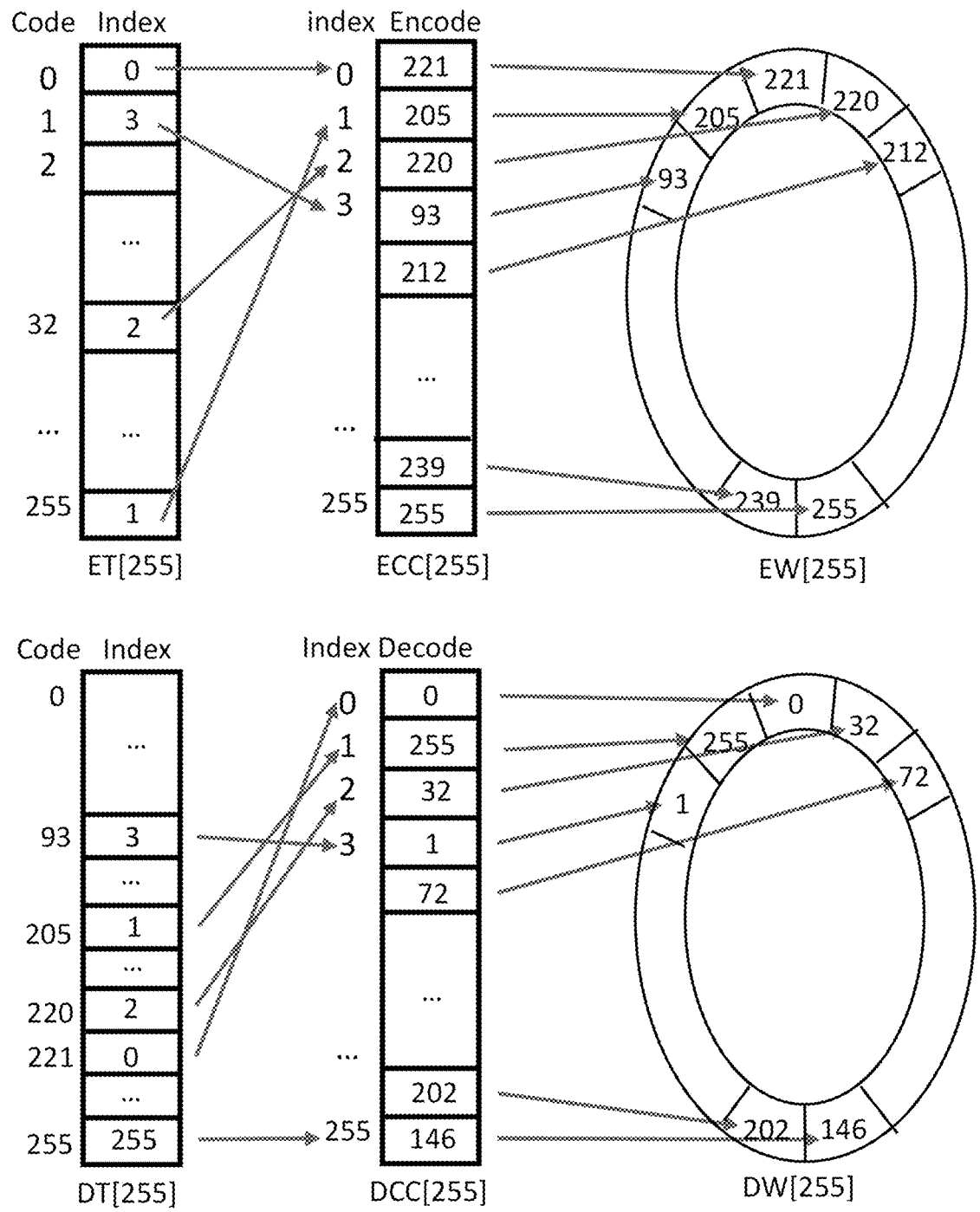
FIG. 6 is a view for tables used in data scrambling and descrambling methods in accordance with an exemplary embodiment of the present disclosure.

The EW table, which has a circular shape, may be constructed from the ECC table as illustrated in FIG. 6. Specifically, the code of ECC[0] is placed in EW[128], the code of ECC[1] is placed in EW[127], the code of ECC[2] is placed in EW[129], and the code of ECC[3] is placed in EW[126]. Further, the code of ECC[254] is placed in EW[255] and the code of ECC[255] is placed in EW[0]. It is noted that the corresponding rank increases as the index increases from 0 to 128 in the EW and then the corresponding rank decreases as the index increases from 129 to 255.

Figure 7:
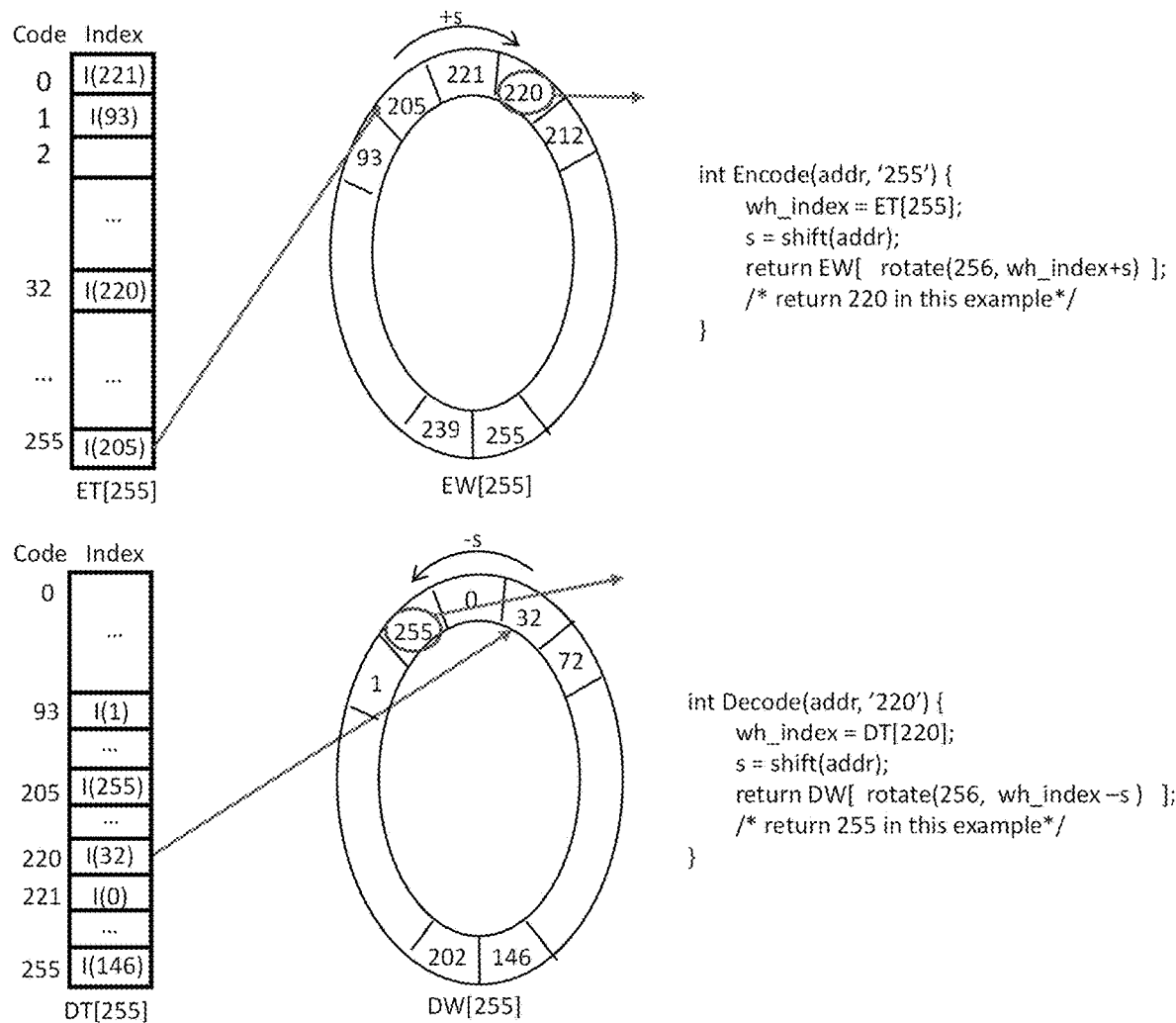
FIG. 7 is a view for explaining an example of data scrambling and descrambling methods using a wheel table in accordance with an exemplary embodiment of the present disclosure.

As illustrated in FIG. 7, it is possible to optimize the ET table to directly point the EW table without going through the ECC table.

Further, as illustrated in FIG. 6, a circular shape DW table may be constructed from the DCC table. In the DW table, the rank increases and then decreases as the index increases.

As illustrated in FIG. 7, it is possible to optimize the DT table to directly point the DW table without going through the DCC table.

FIG. 7 illustrates an encoding process when tables with a circular shape are used. According to the exemplary embodiment, plain code 255 has rank 1 in the FT and ECC tables and cipher code 205 has rank 1 in the PDT and ECC tables as illustrated in FIG. 5. It means that plain code 255 corresponds to cipher code 205.

In FIG. 7, the ET table indicates a specific position (index) in the EW table where the corresponding cipher code exists. In FIG. 7 which illustrates the encoding of plain code 255, an index for the EW table is obtained from the 255-th entry of the ET table and is assigned to wh_index. I(205) in FIG. 7 refers to the index of an entry in the EW table, where cipher code 205 exists.

After finding the index, the random number s is generated by the function shift(addr) with an input of the storage address. Then the adjustment rank is calculated by adding s to wh_index. As the adjustment rank may be out of index range 0~255, the function rotate( ) rearranges the adjustment rank within 0~255.

Finally, the cipher code pointed by the adjustment rank in the EW table is returned. In the example of FIG. 7, plain code 255 is converted to cipher code 220.

FIG. 7 further illustrates a decoding process when tables with a circular shape are used. In this example, cipher code 220 is decoded to a plain code. First, an index for the DW table is obtained from the 220-th entry of the DT table and is assigned to wh_index. In FIG. 7, I(32) refers to an index for the DW table, where plain code 32 exists. In the next, the random number s is generated by the function shift(addr) with an input of the storage address. Then, the adjustment rank is calculated by subtracting s from wh_index. If the adjustment rank is out of index range, the function rotate( ) rearranges the adjustment rank within the index range. Lastly, the plain code pointed by the adjustment rank is returned. In the example of FIG. 7, cipher code 220 is converted to plain code 255.

Figure 8:
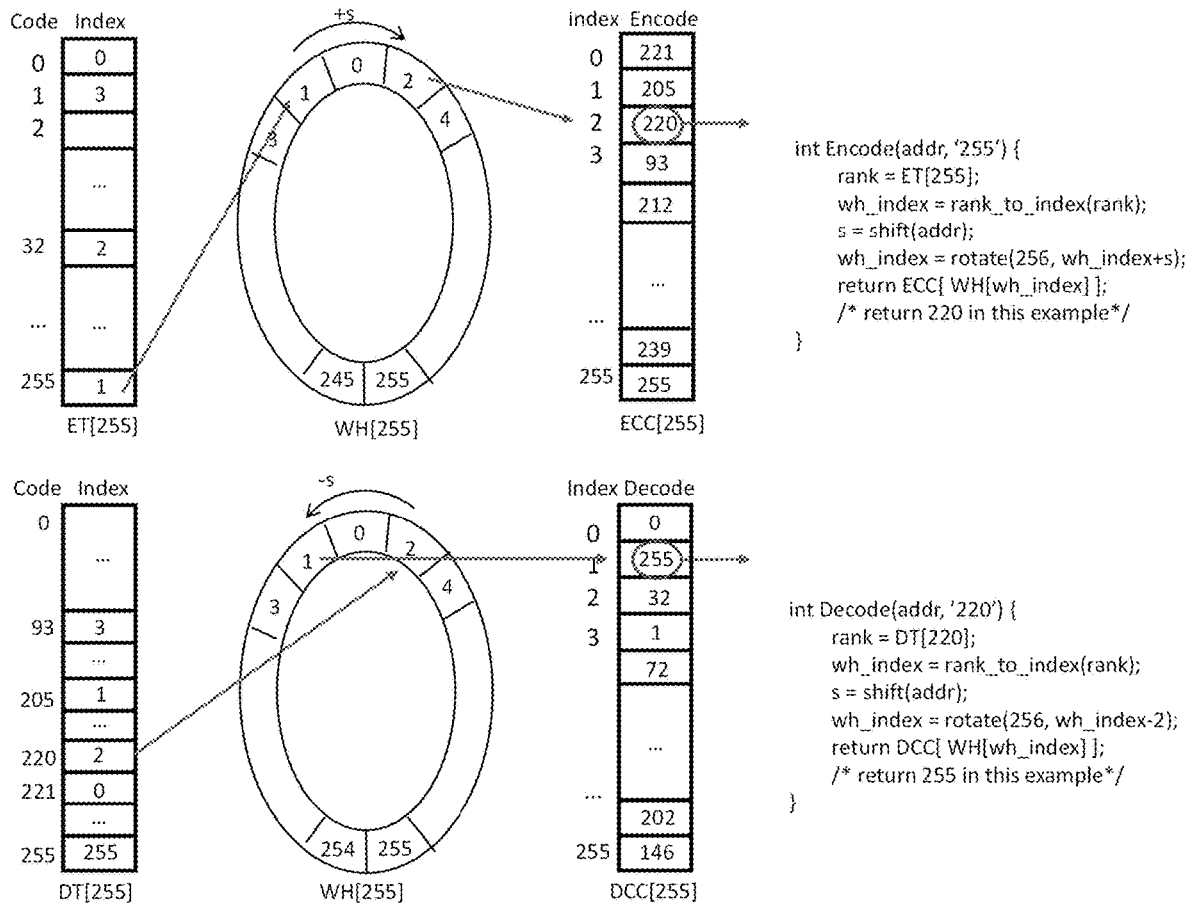
FIG. 8 is a view for explaining an example of data scrambling and descrambling methods using another wheel table in accordance with an exemplary embodiment of the present disclosure.

The encoding and decoding operations may be performed using single WH table seen in FIG. 8, rather than using EW and DW tables. In FIG. 8, the WH table is constructed by converting one-dimensional index values into a wheel shape. Specifically, index 1 is located at the left side of index 0 and index 2 is located at the right side of index 0 in the WH table.

FIG. 8 illustrates an encoding process using the WH table. In Encode( ) function of FIG. 8, plain code 255 has rank 1 as indicated by ET[255]. This rank is assigned to the variable rank. Then, the function rank_to_index( ) is applied to figure out an index in WH table for the given rank 1. And the index for the WH table is assigned to the variable wh_index. In the next, the random number s is generated by the function shift(addr) with an input of the storage address and the adjustment index is calculated by adding s to wh_index. As the adjustment index may be out of index range 0~255, the function rotate( ) rearranges the adjustment index within the index range. Now, WH[wh_index] points an entry in the ECC table and the cipher code in the entry is returned. In the example of FIG. 8, WH[wh_index] is 2 and cipher code 220 is returned from ECC[2].

FIG. 8 further illustrates a decoding process using the WH table. In the above-described exemplary embodiment, plain code 255 is converted to cipher code 220 and, now, cipher code 220 is decoded. In Decode( ) function of FIG. 8, the rank of cipher code 220 is obtained from the 220-th entry of the DT table and is assigned to the variable rank. Then, the function rank_to_index( ) translates the rank to an index for the WH table. And the index is assigned to the variable wh_index. In the next, the random number s is generated by the function shift(addr) with an input of the storage address and the adjustment index is calculated by subtracting s from wh_index. As the adjustment index may be out of index range 0~255, the function rotate( ) rearranges the adjustment index within the index range. Now, WH[wh_index] points an entry in DCC table and the plain code in the entry is returned. In the example of FIG. 8, WH[wh_index] is 1 and plain code 255 is returned from DCC[1].

To control cipher code densities, a random number may need to be generated by a non-uniform probability density function. In the exemplary embodiment, the function shift (addr) is used to generate a random number.

Figure 9A:
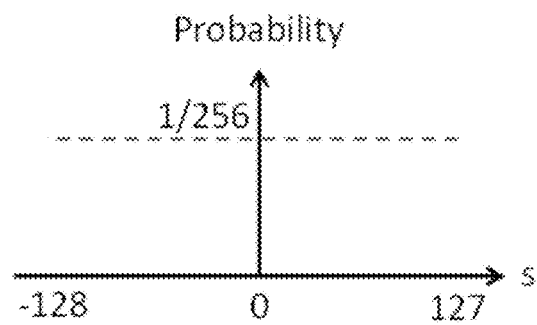
FIG. 9A to 9D are views illustrating a probability density function in accordance with an exemplary embodiment of the present disclosure.
Figure 9B:
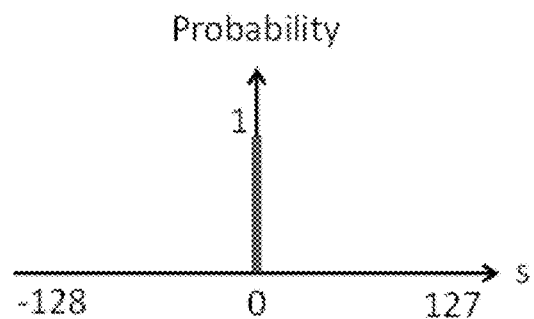
Figure 9C:
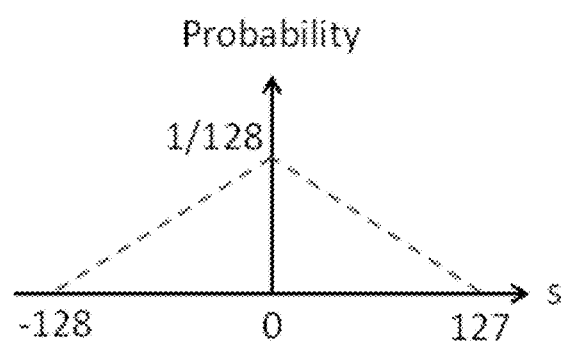
Figure 9D:
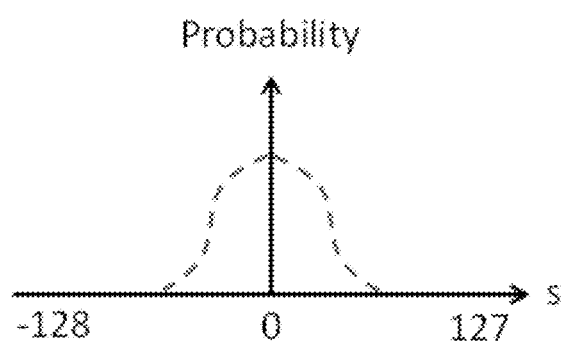

FIGS. 9A-9D illustrate various probability density functions. FIGS. 9B, 9C, and 9D illustrate non-uniform probability density functions in which each number has different probability. Specifically, 0 has the highest probability. And other numbers have lower probability proportional to the distance from 0. Particularly, in FIG. 9B, the probability of 0 is 100%. It means that this probability density function always generates 0 as a random number. Also, a uniform probability density function may be used as illustrated in FIG. 9A and, in this case, cipher codes may have uniform densities. Also, the degree of cipher code densities may be controlled by selecting a probability density function among a plurality of probability density functions having different non-uniformity.

Probability density functions are not limited to those illustrated in FIGS. 9A-9D and any kind of probability density functions may be used.

As mentioned previously, a source of non-uniformity in plain codes may be needed to control code densities. To this end, in the exemplary embodiment of present disclosure, appearance frequencies of plain codes are used. An initial table for encoding such as FT table may be built from initial information about appearance frequencies. And, if necessary, other tables may be built from the FT table.

As another exemplary embodiment, tables may be dynamically reconfigured by examining plain codes and cipher codes after, before or during the encoding process.

In FIG. 5, plain code 32 has rank 2 in the FT table. If plain code 32 is encoded, a dynamic reconfiguration technique may be performed. Particularly, it may increase the rank of plain code 32 by one step. Then, the rank of plain code 32 rises from 2 to 1 and the rank of plain code 255 drops from 1 to 2. If necessary, ET, DCC, and DW tables may be modified in accordance with the rank changes. In FIG. 10, rank_up( ) in the Encode( ) function performs this reconfiguration task.

Increasing step is not limited to 1 and the rank may be increased by n (n>=1). Also, the dynamic reconfiguration technique may increase the rank of a plain code to the highest, 0 in the previous example, regardless of the previous rank. For example, if plain code 32 is encoded, its rank rises from 2 to 0 and ranks of plain code 0 and 255 drop to 1 and 2, respectively, in FIG. 5.

The dynamic reconfiguration technique may be performed after, before or during decoding process. For example, when cipher code c is converted to plain code 32, the dynamic reconfiguration technique may increase the rank of plain code 32 by n step in the FT table (n>=1). Or the rank of plain code 32 may rise to the top regardless of the previous rank. And, if necessary, the ET, DCC, and DW tables may be modified in accordance with the rank changes. In FIG. 10, rank_up( ) in the Decode( ) function performs this reconfiguration task.

The dynamic reconfiguration may be performed at every encoding/decoding time or may be performed periodically or may be performed when some conditions are met. Furthermore, the increasing and decreasing step may change dynamically. For example, the increasing step may be 1 for a period and it may be n (n>=1) for the next period. Or the rank may be changed to the top regardless of previous rank.

As another exemplary embodiment, the dynamic reconfiguration may be performed at every P conversion time and, during P conversions, appearance frequencies of plain codes are collected. After P conversions, the FT table may be reconfigured with the collected appearance frequencies. If necessary, other tables such as ET, DCC, and DW tables may be modified in accordance with the rank changes.

Through controlling cipher code densities, the present disclosure may make the average cell state of non-volatile memory close to a target state.

Figure 11A:
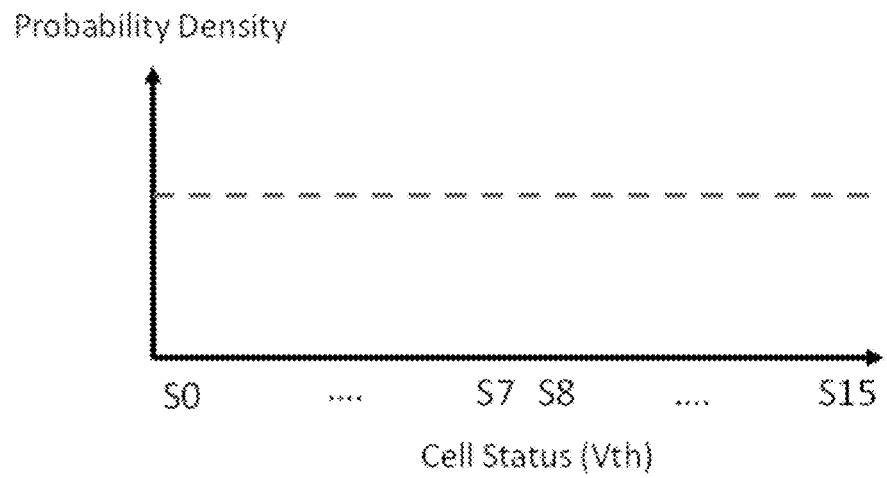
FIG. 11A to 11B are views for explaining ratios of cell states.

A quad-level cell (QLC) flash memory stores four bits per cell. The state of a cell after erase operation is defined as S0 and a programming operation may change the state to S0, S1, . . . , S14, and S15. States S0 to S15 of a cell are represented by numerical values of 0 to 15. If scrambling techniques of the related art are used to generate pure-random cipher codes, the average cell state is close to 7.5, which is the median value as illustrated in FIG. 11A.

Figure 11B:
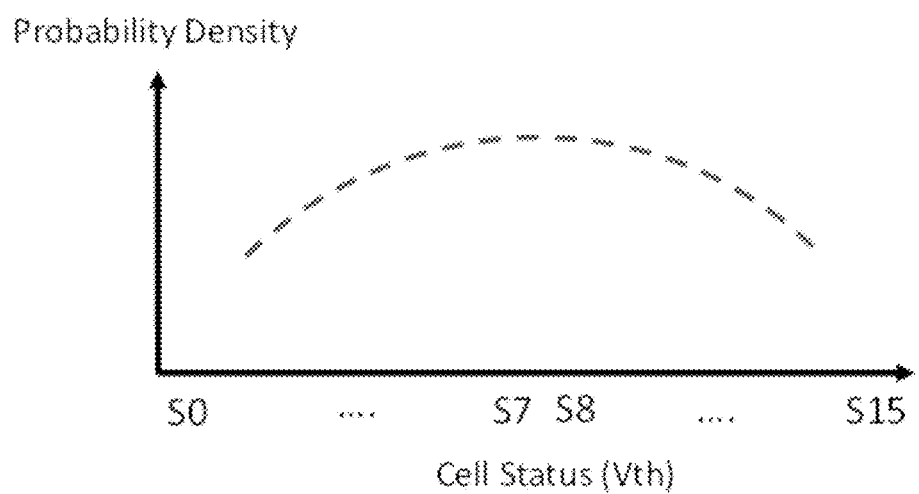

According to yet another exemplary embodiment of the present disclosure, controlling cipher code densities may make the average cell state close to the median value. By setting the target PD value to 7.5, the PDT table may be built to give high ranks to cipher codes making the cell state close to 7.5. Then, the exemplary embodiment of the present disclosure may increase densities of high-rank cipher codes, making the average cell state close to 7.5 as illustrated in FIG. 11B.

It is understood that the target PD value is not limited to the median value but any number can be the target PD value.

Some cells may have fringe states. For example, states in regions 0, 1, 3 or 4 may be regarded as fringe states in FIG. 12. And cells with fringe states may have negative influence on performance, reliability, endurance, and energy consumption criterions of the non-volatile memory.

To reduce ratio of cells with fringe states, according to yet another exemplary embodiment of the present disclosure, a probability density function may be dynamically selected among a plurality of probability density functions by examining information in a history queue. The history queue may be the First-In-First-Out (FIFO) queue, which collects M previous plain and corresponding cipher codes during encoding and decoding processes. From cipher codes in the history queue, cell states may be induced.

During encoding process in FIG. 6, with the rank of a plain code in the ET table, one-to-one corresponding cipher can be obtained from the ECC table. Here, the one-to-one corresponding cipher code is the code with the same rank of the plain code in the ECC table. According to exemplary embodiment of the present disclosure, however, the plain code may not be converted to the one-to-one cipher code. Rather, in FIG. 6, the adjustment rank is calculated with a random number and the plain code is converted to the cipher code with the adjustment rank.

Thus, the one-to-one corresponding cipher code is not the code which is actually stored in the non-volatile memory device. Also, the cell state induced from the one-to-one corresponding cipher code may be incorrect.

Though the cipher code and the induced cell state may be incorrect, the one-to-one corresponding cipher code may be an important clue to conjecture a cell state. If a random number is generated by a non-uniform probability density function, the adjustment ranks is not far from the original rank with high probability. Therefore, the one-to-one corresponding cipher code may have similar cell state to the cipher code of the adjustment rank. And it is why we can conjecture cell states from one-to-one corresponding cipher codes.

Figure 12:
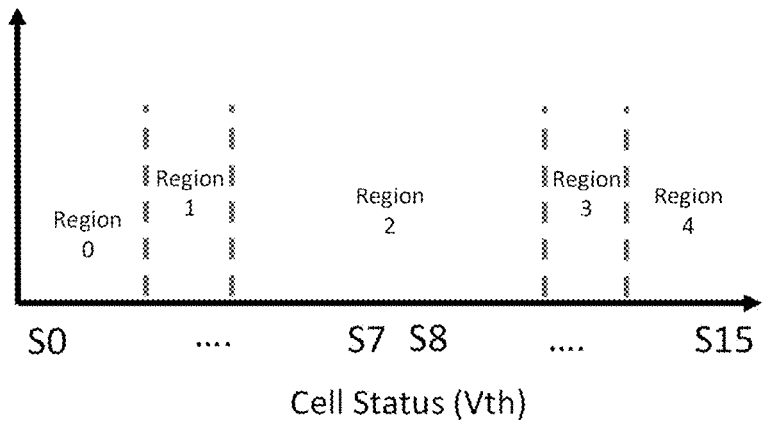
FIG. 12 is a view for explaining status regions of cells in accordance with another exemplary embodiment of the present disclosure.

Referring to FIG. 12, according to the exemplary embodiment of the present disclosure, it may be possible to determine a majority region of cell states induced from the history queue. If the majority region is 0, 1, 2, 3, or 4, uniform or low-degree non-uniform probability density function may be used to generate a random number. Otherwise, high-degree non-uniform probability density function may be used for random number generation.

Figure 13:
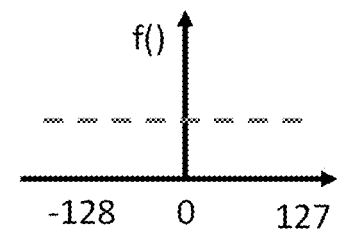
FIG. 13 is a view for selection of a probability density function using a history queue in accordance with another exemplary embodiment of the present disclosure.
Figure 13:
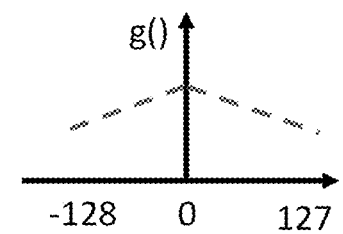
Figure 13:
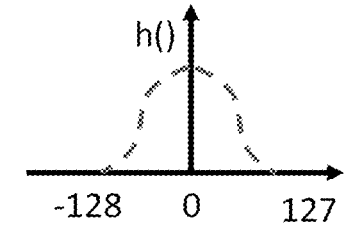

In FIG. 13, this history queue based selection is implemented in Eval_HIST( ) function. Here, a random number s is generated by a probability density function selected by the return value of Eval_HIST( ) function.

For example, if the majority region is region 0 or 4, Eval-HIST( ) returns 0 or 4. Then shift_0( ) function is called to use a uniform probability density function for random number generation. If the majority region is region 1 or 3, Eval_HIST( ) returns 1 or 3. In this case, shift_1( ) function is called to use a low-degree non-uniform probability density function. Otherwise, Eval-HIST( ) returns 2 and shift_2( ) function is called to use a high-degree non-uniform probability density function.

In the above-described exemplary embodiment, the cell state is divided into five regions. However, it can be divided into an arbitrary number of regions. Also, in the above-described exemplary embodiment, Eval_HIST( ) evaluates the history to determine a region at every time. However, Eval_HIST( ) may determine a region periodically or when some conditions are met.

Figure 14:
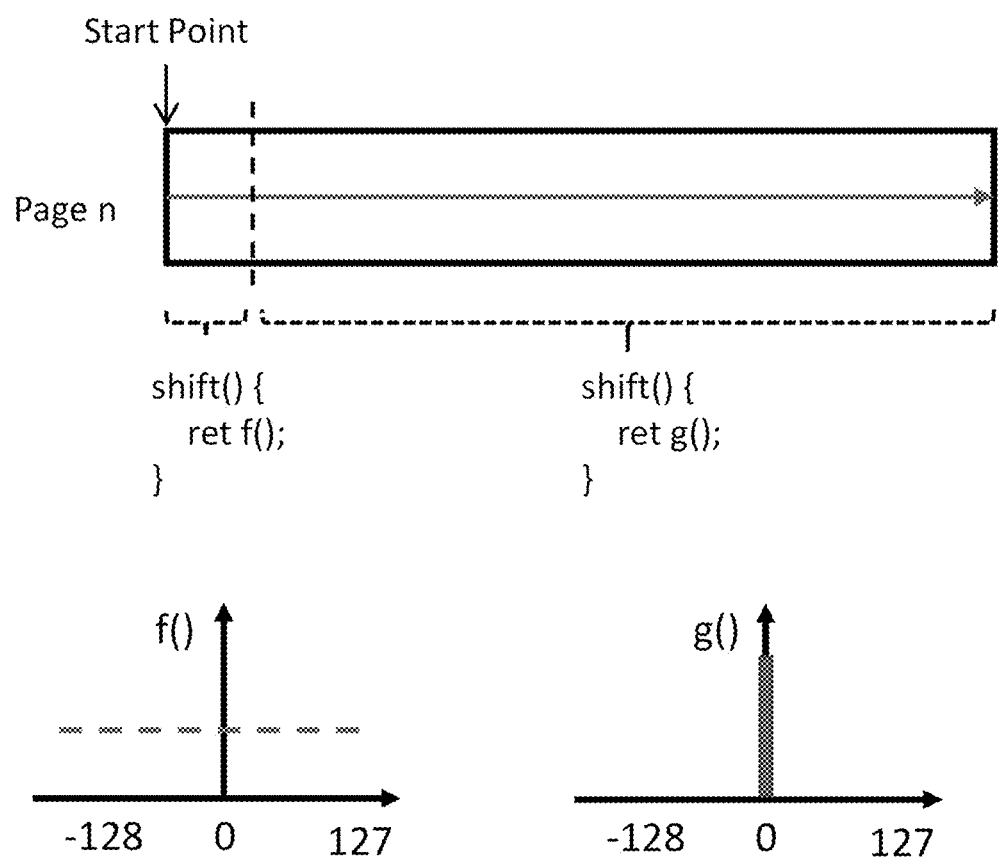
FIG. 14 is a view for changing a probability density function after an adaptation period in accordance with another exemplary embodiment of the present disclosure.
Figure 15:
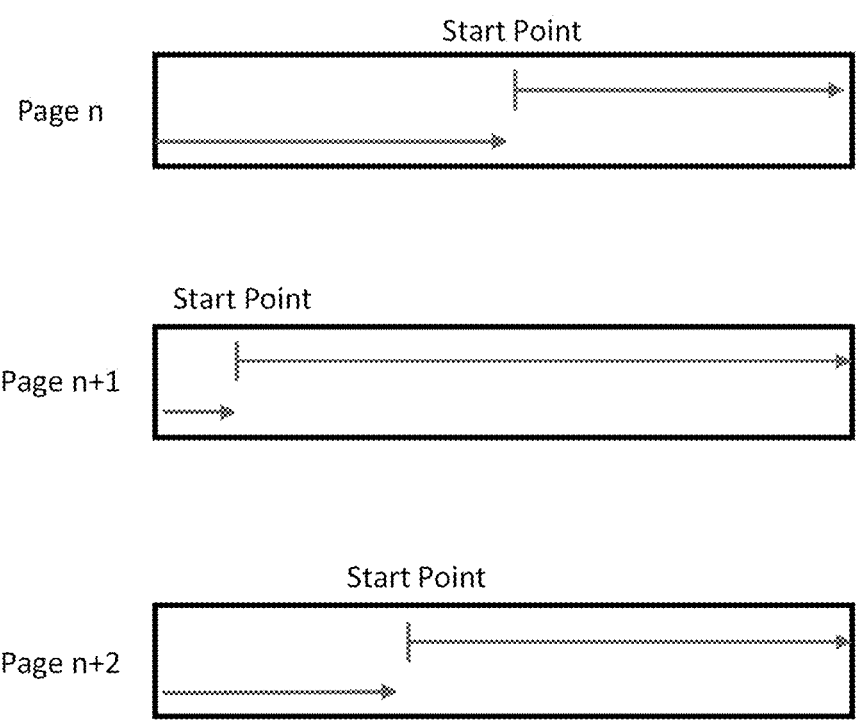
FIG. 15 is a view for the start point variation in accordance with another exemplary embodiment of the present disclosure.

The non-volatile memory device may store data in a specific size. For example, read and write unit size may be multiples of pages. And the scrambling and descrambling may be done in the unit of the specific size. In the exemplary embodiment of the present disclosure, the dynamic reconfiguration and history queue methods try to adapt to a code pattern. And the adaption may be applied to each of the unit. In FIG. 14, the adaption may observe data from the beginning of the unit and, if a code pattern is identified, it may decide a probability density function. Until the code pattern is identified, uniform or low-degree non-uniform probability density function may be used. Also, as illustrated in FIG. 15, the adaptation may observe data from any position in the unit.

When the above-described exemplary embodiment is implemented by hardware, ET and DCC tables used for encoding and decoding may be consolidated to single table implemented with an associative memory. The associative memory is consisted with registers storing values and arithmetic/logic circuits for adding, comparing, and transmitting data. Particularly, the associative memory can transmit data from a register to adjacent registers.

Figure 16:
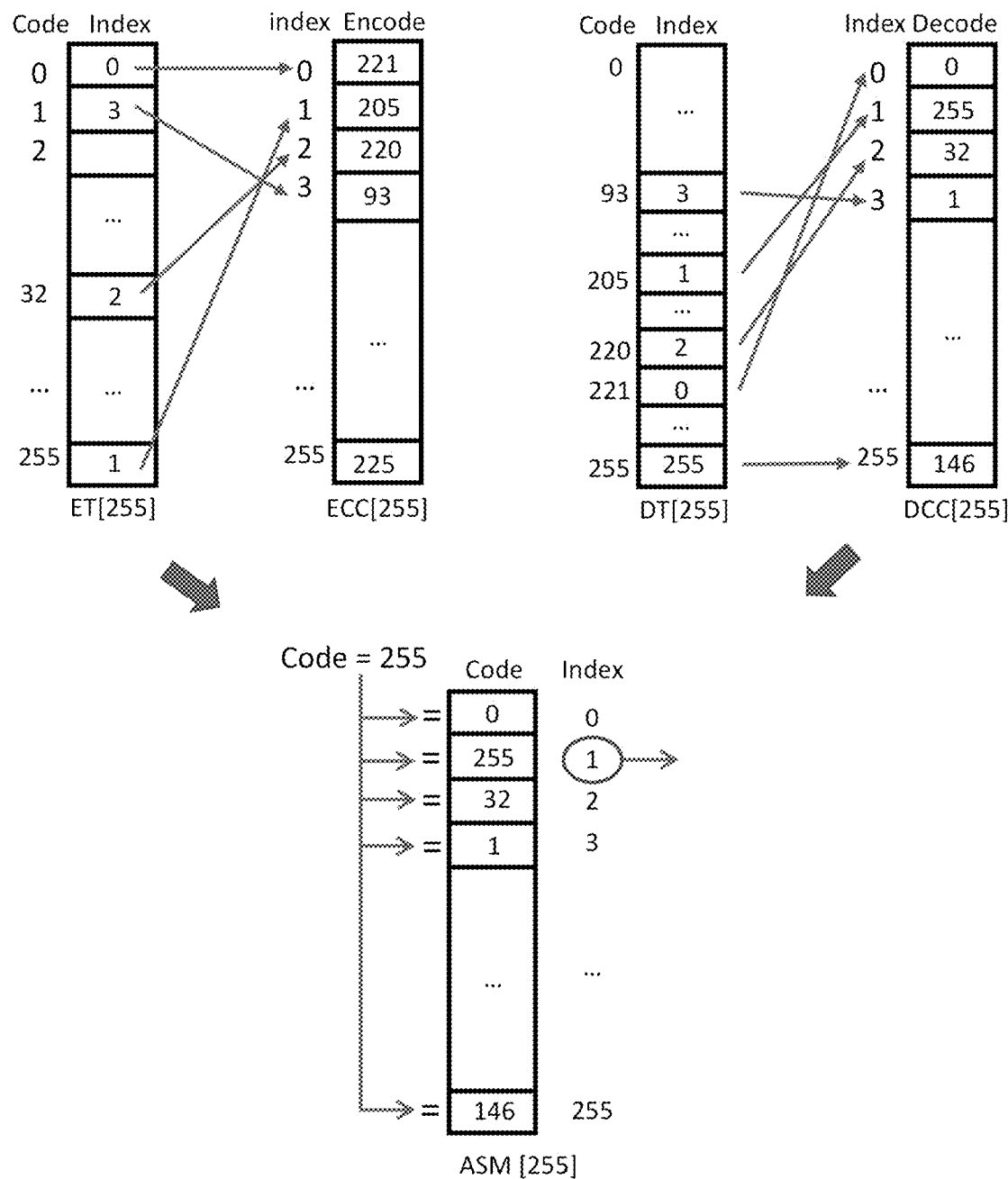
FIG. 16 is a view for explaining a table implemented with an associative memory.

In FIG. 16, the ET and DCC tables may be consolidated to an ASM table implemented with the associative memory. Each entry of the ASM table has a plain code. And a plain code may be obtained with an index pointing to a specific entry. Also, each entry has a comparator (circuit for comparing data) to compare its code value with a given code. Thus, the index of an entry having a specific code value can be searched by providing a code value to the ASM table. For example, in FIG. 16, if plain code 255 is provided to the ASM table, all entries simultaneously compare their code values with 255 and the ASM returns the index number of an entry having 255. These features are implemented in Search_Index_With_Code( ) and Search_Code_With_Index( ) functions. The Search_Code_With_Index( ) function returns a code value in the entry pointed by the given index number. And the Search_Index_With_Code( ) function compares all entries with a given code value and returns the index of an entry having the code value.

FIG. 17 illustrates encoding and decoding operations when the ASM table is used. Rather than accessing the ET table, the encoding operation searches for the index of an entry having a specific code value through the Search_Index_With_Code( ) function. And the decoding operation gets a plain code with an index number through the Search_Code_With_Index( ) function without accessing the DCC table.

Figure 18A:
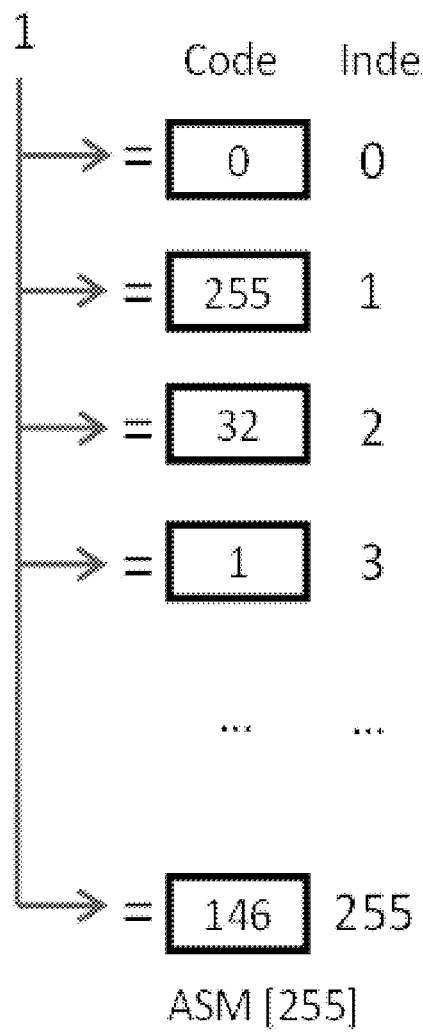
FIG. 18A to 18C are views for explaining dynamic table reconfiguration when an associative memory table is used.
Figure 18B:
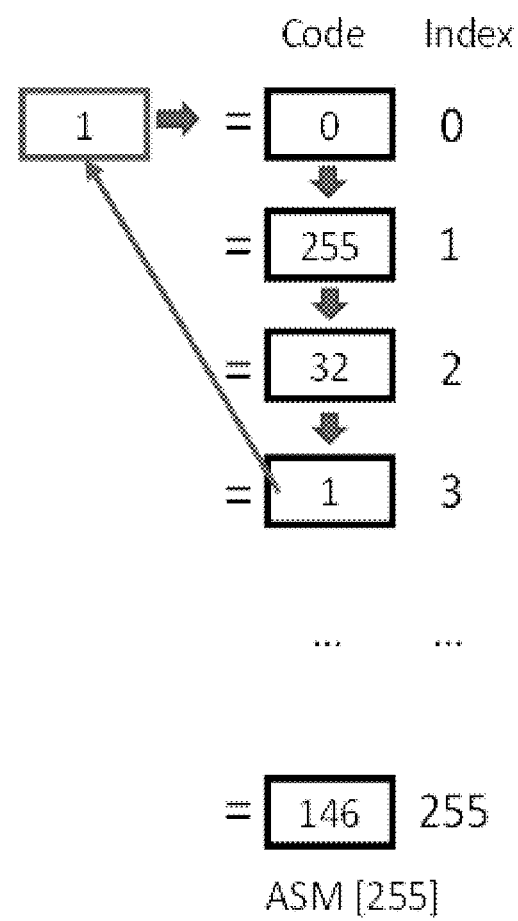
Figure 18C:
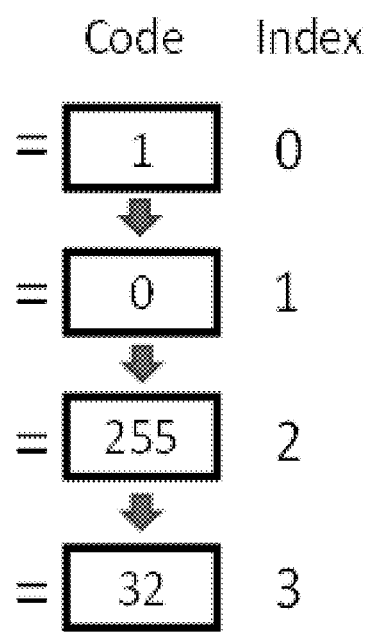
Figure 18C:
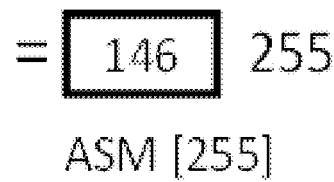

FIGS. 18A-C illustrate the dynamic reconfiguration technique when the ASM table is used. In detail, FIGS. 18A-18C illustrate table changes to increase the rank of plain code 1 from 3 to 0. In FIG. 18A, plain code value 1 is provided to the ASM table. Then, all entries compare their values with 1. As ASM[3] has plain code 1, plain code 1 in ASM[3] moves to a temporary register as illustrated in FIG. 18B. Further, ASM[0] moves to ASM[1], ASM[1] moves to ASM[2], and ASM[2] moves to ASM[3] and the value in the temporary register moves to ASM[0]. These movements may be performed in parallel by the data transfer feature of the associative memory. FIG. 18C illustrates the ASM table after the dynamic reconfiguration. Now, in the ASM table, the rank of plain code 1 is 0.

Figure 19:
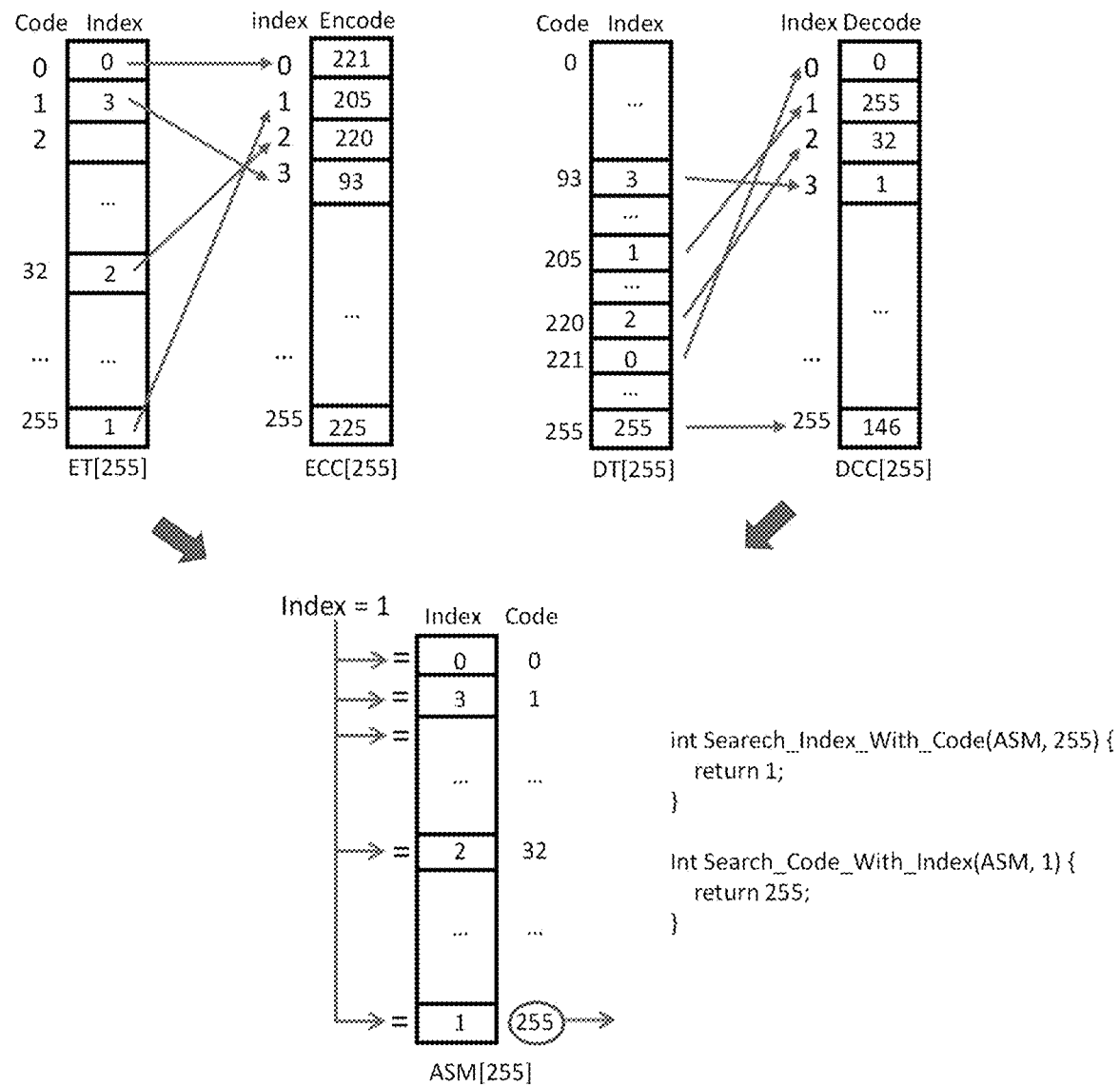
FIG. 19 is a view for explaining an associative memory table configured in a different way in accordance with another exemplary embodiment of the present disclosure.

In yet another exemplary embodiment, the associative memory may be configured in a different way. In FIG. 19, each entry of the ASM table has an index number. And an index may be obtained with a code pointing a specific entry. Also, each entry has a comparator (circuit for comparing data) to compare its entry value with a given index number. Thus, an entry having a specific index number may be searched and the ASM returns the code value pointing the entry. These features are implemented in Search_Index_With_Code( ) and Search_Code_With_Index( ) functions. The Search_Code_With_Index( ) function compares all entry values with a given index number and returns the code value of the entry having the index number. The Search_Index_With_Code( ) function returns an index in the entry pointed by the given code number.

Figure 20A:
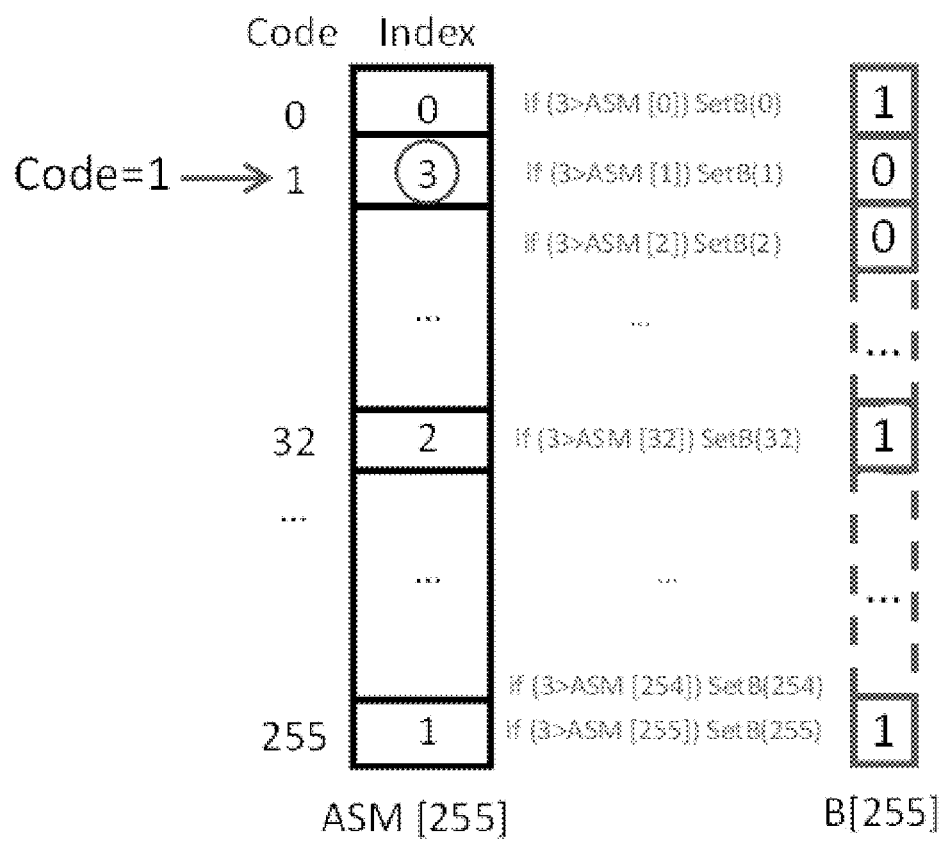
FIG. 20A to 20B are views for explaining a dynamic table reconfiguration when another shape of associative memory table is used.
Figure 20B:
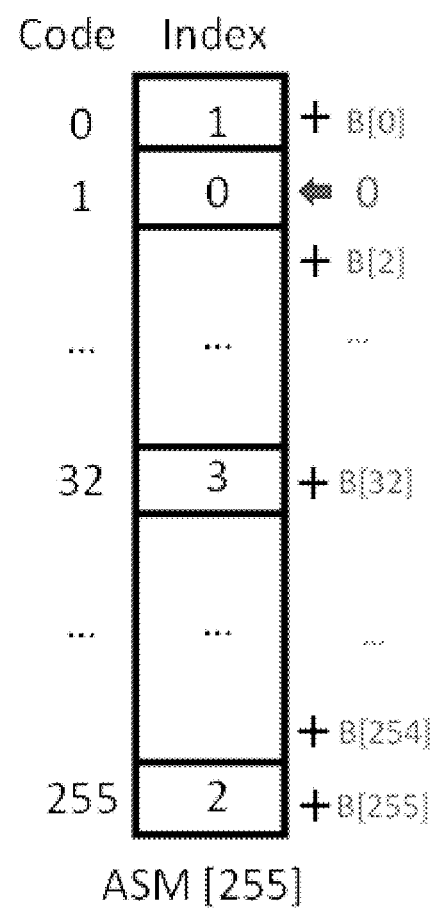

FIGS. 20A-20B illustrate the dynamic reconfiguration technique when the ASM table is configured as described in the above-described exemplary embodiment. Specifically, FIGS. 20A-20B illustrate table changes to increase the rank of plain code 1 from 3 to 0. In FIG. 20A, plain code 1 points entry 1 in which index 3 exists. Here, the index number means the rank of the corresponding plain code. Now, index (rank) 3 is retrieved from entry 1. In the next, all entries of the ASM table compare their values with 3. If the entry value is smaller than 3, corresponding bit in the table B is set to 1. Otherwise, corresponding bit in the table B is set to 0. In FIG. 20A, 0-th, 32-nd, and 255-th bits in the table B are set to 1 because entry values are smaller than 3.

Next, as illustrated in FIG. 20B, values of the table B are added to entry values in the ASM table. If the bit in the table B is 1, 1 is added to the entry value and, if it is 0, 0 is added. There is one exception of entry 1, which is for the plain code 1. The entry 1 is set to 0 regardless of previous value. Now, in FIG. 20B, the code 1 has rank 0 and ranks of codes 0, 32, and 255 are increased by one.

To enhance performance, encoding/decoding operations and the dynamic reconfiguration may be performed in parallel. To enhance performance further, a code may be divided into sub-codes and those sub-codes may be encoded and decoded simultaneously.

Figure 21:
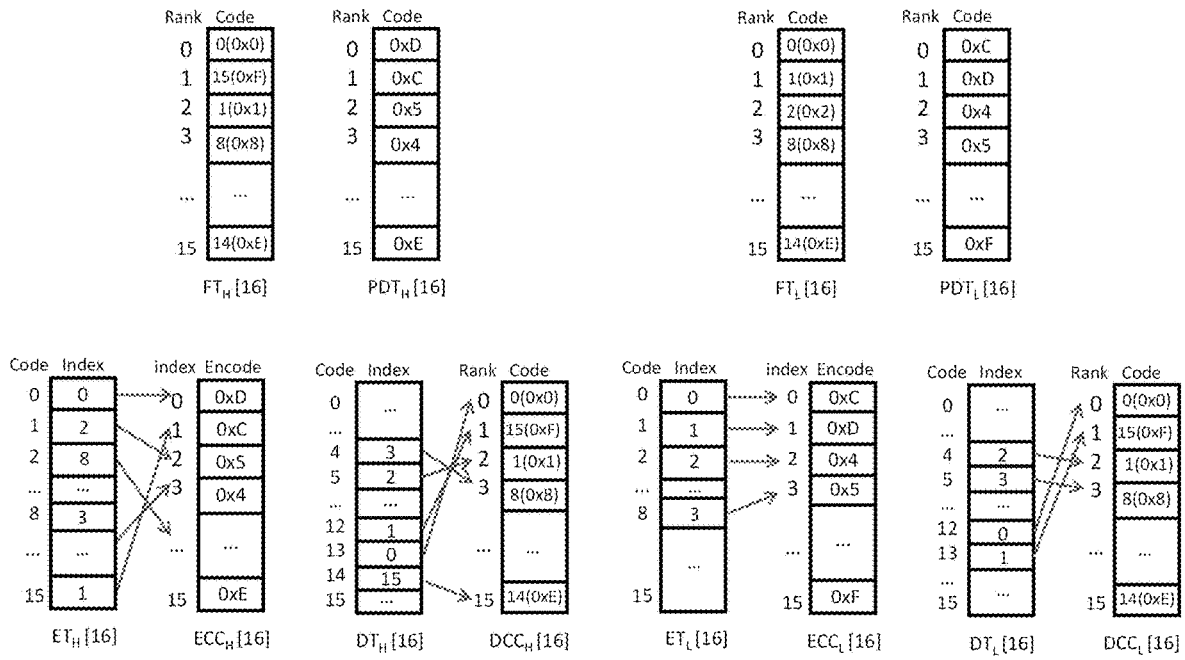
FIG. 21 is a view for explaining scrambling and descrambling methods which divide a code into sub-codes.

FIG. 21 illustrates a table configuration for dividing an 8-bit code into two 4-bit sub-codes, which may be encoded or decoded simultaneously. The high 4-bit sub-code is called "high nibble" and the low 4-bit sub-code is called "low nibble". Now, $FT_H$ is built according to appearance frequencies of high nibble values. Also, $PDT_H$ table is built according to PDs of 4-bit cipher codes. $ET_H$, $ECC_H$, $DT_H$, and $DCC_H$ tables may be built with the $FT_H$ and $PDT_H$ tables and, if necessary, $EW_H$, $DW_H$, WH tables may be built. As illustrated in FIG. 21, 16 entries exist in those tables.

In the same way, $FT_L$ and $PDT_L$ tables may be built in the order of the appearance frequency of the low nibble and the PD of 4-bit cipher code. $ET_L$, $ECC_L$, $DT_L$, and $DCC_L$ tables may be built with these tables and, if necessary, $EW_L$, $DW_L$, WH tables may be built. As illustrated in FIG. 21, 16 entries exist in those tables.

$FT_H$ and $FT_L$ may be different from each other because the high and low nibbles may have different appearance frequencies. Further, $PDT_H$ and $PDT_L$ may be different from each other because the high and low nibbles may have different PD values.

Figure 22:
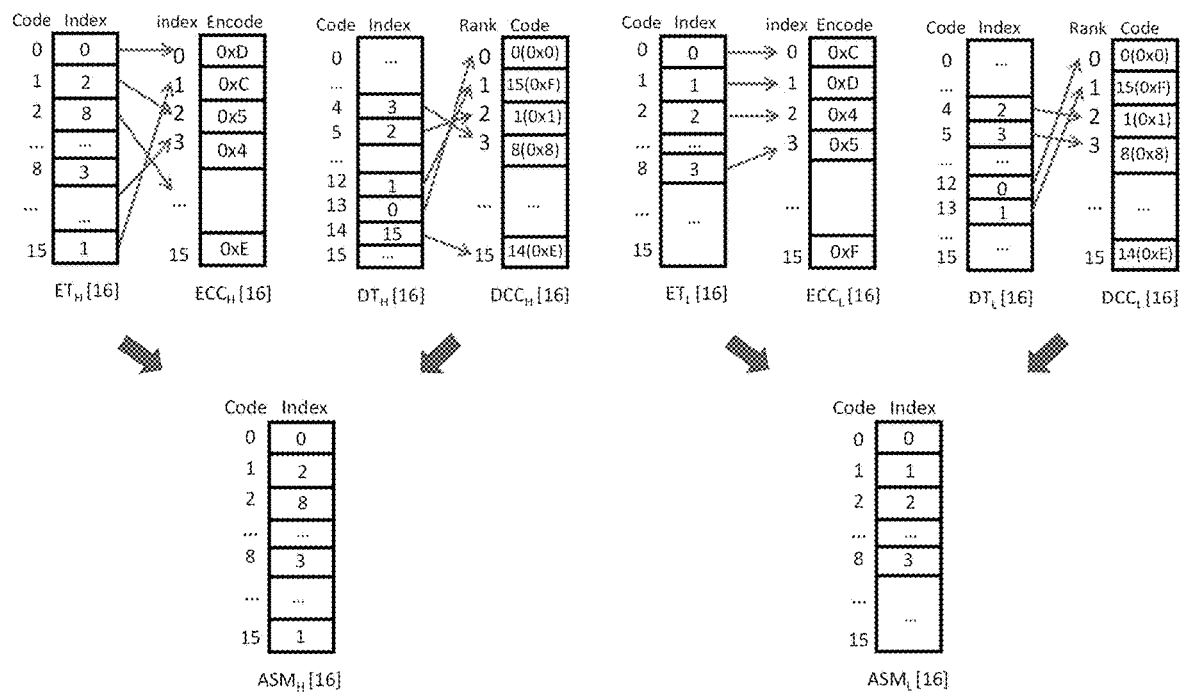
FIG. 22 is a view for explaining a method which divides a code into multiple sub-codes and performs scrambling and descrambling of sub-codes in parallel.

As illustrated in FIG. 22, $ET_H$ and $DCC_H$ tables may be consolidated to single $ASM_H$ table implemented with the associative memory. Further, $ET_L$ and $DCC_L$ tables may be consolidated to single $ASM_L$ table implemented with the associative memory. The encoding and decoding operations using the associative memory is the same as those of the above-described exemplary embodiment except that the conversion is performed in the unit of 4-bit nibble, not 8-bit code.

Figure 23:
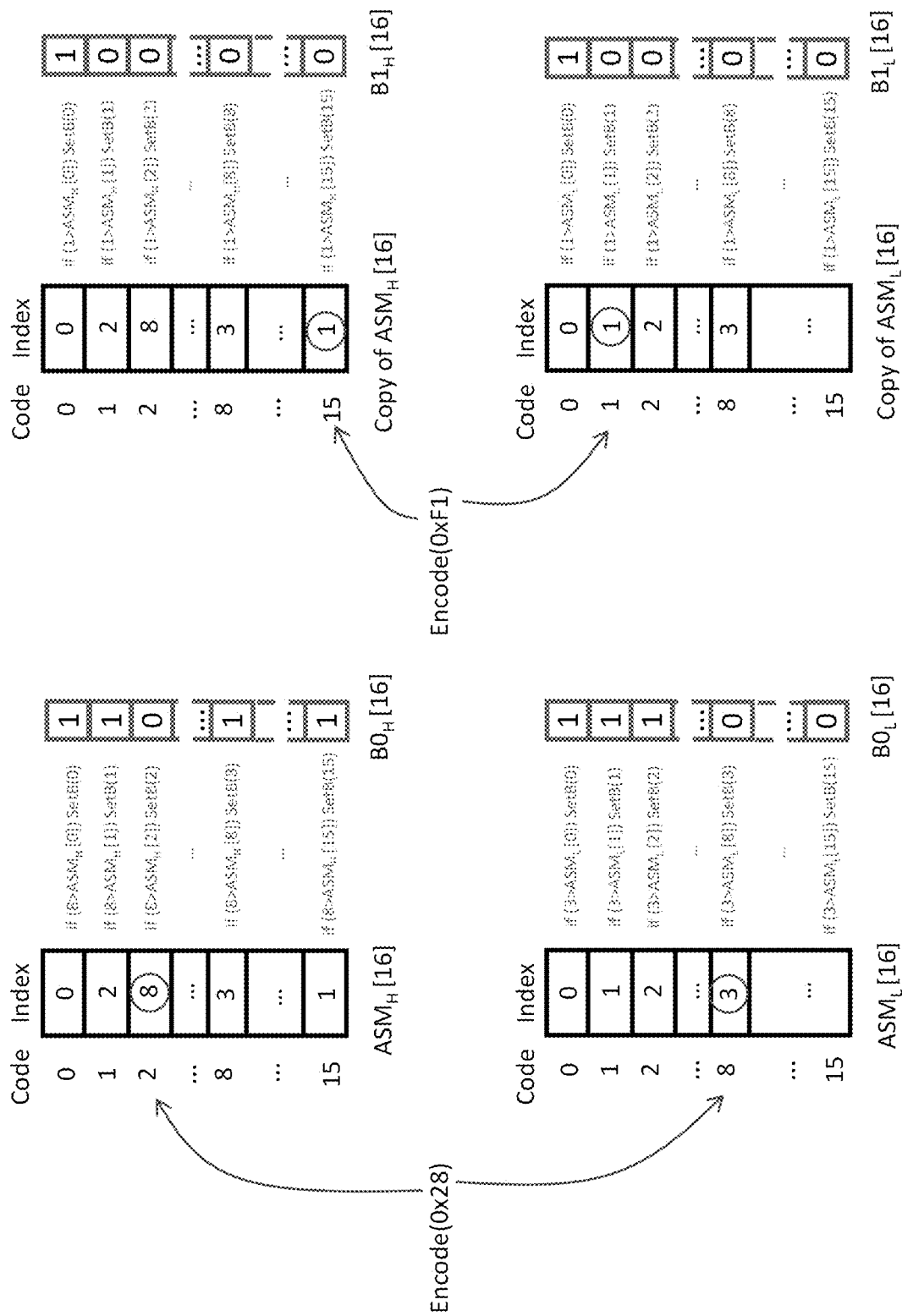
FIG. 23 is a view for explaining a method which divides a plurality of codes into multiple sub-codes and scrambles/descrambles sub-codes in parallel.

FIG. 23 illustrates encoding operations of two plain codes 0x28 and 0xF1 (a number with 0x refers to a hexadecimal number). First, the plain code 0x28 is divided into two 4-bit sub-codes (nibbles) 0x2 and 0x8. Next, the high nibble 0x2 is encoded with the $ASM_H$ table. After, before, or during encoding, the dynamic reconfiguration may be performed. In detail, the index number (rank) of 0x2 is 8 in the $ASM_H$. Then, all entries in the $ASM_H$ compare their values with 8 and, if their values are smaller than 8, corresponding bits in the $B0_H$ table are set to 1.

Further, the low nibble 0x8 is encoded using the $ASM_L$ table and the dynamic reconfiguration may be performed. In detail, the index (rank) of the 0x8 is 3 in the $ASM_L$. Then all entries in the $ASM_L$ compare their values with 3 and, if their values are smaller than 3, corresponding bits in the $B0_L$ are set to 1.

As an exemplary embodiment of parallel encoding and decoding of multiple plain codes, another plain code 0xF1 may be encoded and decoded simultaneously while encoding and decoding the previous plain code 0x28. First, the plain code 0xF1 is divided into two sub-codes (nibbles) 0xF and 0x1. And the high nibble 0xF is encoded with "Copy of $ASM_H$" table. Here, "Copy of $ASM_H$" is another associative memory table identical to the $ASM_H$ and, like this, a plurality of $ASM_H$ tables may be used for parallel operations. However, if it is possible to simultaneously encode/decode multiple codes with single $ASM_H$ table, one $ASM_H$ table may be used. After, before, or during encoding the high nibble 0xF, the dynamic reconfiguration may be performed. In detail, the index (rank) of the nibble 0xF is 1 in the "Copy of $ASM_H$". Then all entries in the "Copy of $ASM_H$" compare their values with 1 and, if values are smaller than 1, corresponding bits in the $B1_H$ are set to 1.

In the same way, the low nibble 0x1 is encoded using "Copy of $ASM_L$" table. Here, "Copy of $ASM_L$" is another associative memory table identical to the $ASM_L$ and a plurality of $ASM_L$ tables may be used for parallel operations. However, if it is possible to simultaneously encode/decode two codes with single $ASM_L$ table, one $ASM_L$ table may be used. After, before or during encoding the low nibble 0x1, the dynamic reconfiguration may be performed. In detail, the index (rank) of the nibble 0x1 is 1 in the "Copy of $ASM_L$". Then all entries in the "Copy of $ASM_L$" compare their values with 1 and, if values are smaller than 1, corresponding bits in the $B1_L$ are set to 1.

Figure 24:
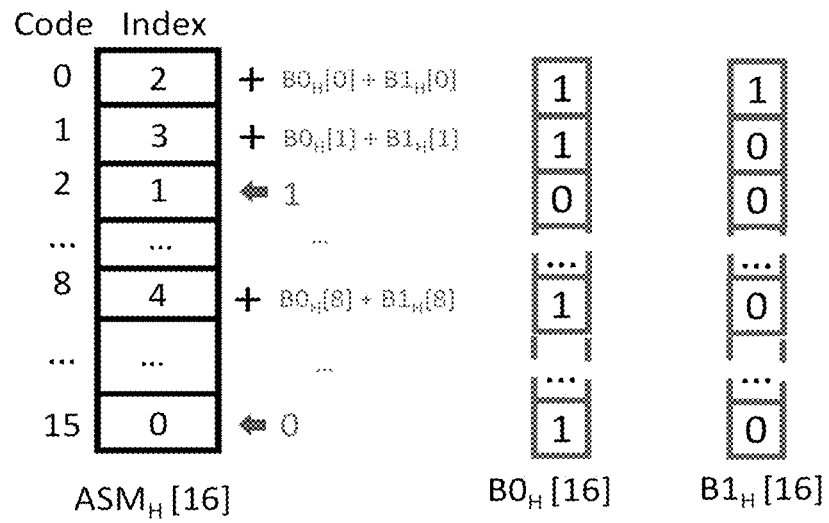
FIG. 24 is a view for explaining a dynamic reconfiguration of a table when multiple codes are scrambled and descrambled in parallel.
Figure 24:
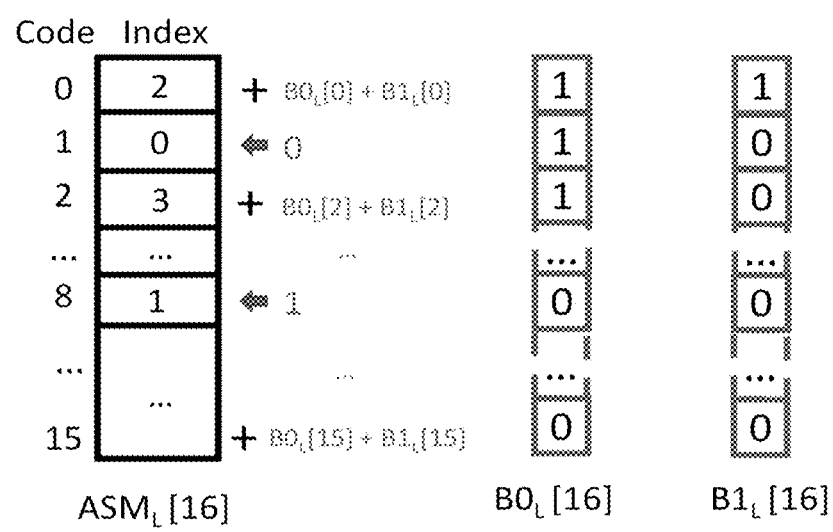

Now, the ASM table may be dynamically reconfigured. Referring to FIG. 24, values in $B0_H$ and $B1_H$ tables are added to entry values in the $ASM_H$ table except for two entries of nibbles 0x2 and 0xF. If both bits in $B0_H$ and $B1_H$ are 1, 2 is added to the entry value in the $ASM_H$ table. In the same way, values in $B0_L$ and $B1_L$ tables are added to entry values in $ASM_L$ table except for two entries of nibbles 0x8 and 0x1.

Finally, 1 and 0 are set to entries for nibbles 0x2 and 0xF in the $ASM_H$ table. This means that ranks of sub-codes 0x2 and 0xF are 1 and 0, respectively. In the same way, 1 and 0 are set to entries for nibbles 0x8 and 0x1 in the $ASM_L$ table. This means that ranks of sub-codes 0x8 and 0x1 are 1 and 0, respectively.

In the above-described exemplary embodiment, the decoding operation may be performed in the similar way to the encoding operation. A cipher code may be divided into two sub-codes and high and low sub-codes may be simultaneously decoded using $DT_H$ and $ASM_H$ tables and $DT_L$ and $ASM_L$ tables, respectively. Further, like the encoding operation, the decoding may be performed on a plurality of codes in parallel.

After decoding a cipher code, a plain code may be obtained. Then the dynamic reconfiguration may be performed with the plain code. In particular, the $ASM_H$ and $ASM_L$ tables may be dynamically reconfigured in the same way to the above-described encoding operation.

In the above-described exemplary embodiment, two codes are simultaneously encoded and decoded. However, the parallel encoding and decoding are not necessarily limited to two codes. Rather, an arbitrary number of codes may be encoded and decoded in parallel. Further, tables may be dynamically reconfigured while encoding and decoding an arbitrary number of codes in parallel.

In the above-described exemplary embodiment, 8-bit codes are divided into two nibbles of 4-bit unit. However, code size and sub-code size are not fixed to those sizes used in the above-described exemplary embodiment. Rather, arbitrary code and sub-code sizes may be used for encoding and decoding. Also, the dynamic reconfiguration technique can be applied to arbitrary code and sub-code sizes.

As an exemplary embodiment of the present disclosure, a triple level cell (TLC) flash memory stores three bits per cell and, thus, stores 24 bits (3 bytes) in eight cells. In this case, a 24-bit code may be divided into 8 sub-codes having 3-bit unit size. Or it may be divided into 4 sub-codes having 6-bit unit size. Or it may be divided into 3 sub-codes having 8-bit unit size. Like this, a code may be divided into sub-codes having an arbitrary size and those sub-codes may be encoded and decoded in parallel. Also, the dynamic reconfiguration may be performed simultaneously after, before, or during encoding and decoding operations.

It will be appreciated that various exemplary embodiments of the present disclosure have been described herein for purposes of illustration, and that various modifications, changes, and substitutions may be made by those skilled in the art without departing from the scope and spirit of the present disclosure. Therefore, the exemplary embodiments of the present disclosure are provided for illustrative purposes only but not intended to limit the technical concept of the present disclosure. The scope of the technical concept of the present disclosure is not limited thereto. The protective scope of the present disclosure should be construed based on the following claims, and all the technical concepts in the equivalent scope thereof should be construed as falling within the scope of the present disclosure.

What is claimed is:

1. A data scrambling method performed by a memory controller coupled to a non-volatile memory device to control a code density, the method comprising:
   receiving, by the memory controller, a plain code which is a code to be stored in the non-volatile memory device and a storage address at which the plain code is recorded;
   determining, by the memory controller, an appearance frequency rank corresponding to the plain code, using an encoding table (ET) including appearance frequency rank information respectively corresponding to plain codes;
   calculating, by the memory controller, an adjustment rank corresponding to the plain code, using the appearance frequency rank and a random number that is generated based on the address of storage address;
   determining, by the memory controller, a cipher code corresponding to the appearance frequency rank of the plain code, using the adjustment rank and an encoding cipher coder (ECC) table including adjustment rank information determined by an objective function for cipher codes to make an average cell state of the non-volatile memory device about equal to a target state to control the code density; and
   storing, by the memory controller, the cipher code in the storage address.

2. The data scrambling method according to claim 1, wherein in the determining of the cipher code corresponding to the appearance frequency rank of the plain code, when the adjustment rank is out of an index range of the ECC table, the adjustment rank is rearranged within the index range of the ECC table.

3. The data scrambling method according to claim 1, wherein the determining of the cipher code corresponding to the appearance frequency rank of the plain code further uses an encoding wheel (EW) table which has a circular shape and is constructed from the ECC table such that the corresponding appearance frequency rank increases as the index of the EW table increases until a half of the entire index and then the corresponding appearance frequency rank decreases as the index of the EW table increases.

4. The data scrambling method according to claim 1, wherein the determining of the cipher code corresponding to the appearance frequency rank of the plain code further uses a wheel (WH) table which has a circular shape and translates the appearance frequency rank information of the encoding table (ET) to an index of the ECC table such that the corresponding appearance frequency rank of the ECC table increases as the index of the WH table increases until a half of the entire index and then the corresponding appearance frequency rank of the ECC table decreases as the index of the WH table increases.

5. The data scrambling method according to claim 1, wherein a random number is determined using one of a plurality of non-uniform probability density functions in which 0 has the highest probability and other numbers have probabilities proportional to the distance from 0 and,
wherein the one of the plurality of non-uniform probability density functions is selected with information about cell states and,
wherein the cell state is conjectured from a history queue that collects recently translated plain and cipher codes.

6. The data scrambling method according to claim 1, further comprising:
reconfiguring, by the memory controller, the appearance frequency rank information of the encoding table (ET),
wherein the reconfiguring of the appearance frequency rank information of the encoding table (ET) includes:
increasing an appearance frequency rank of a recently translated plain code by a predetermined step value in the encoding table (ET).

7. The data scrambling method according to claim 1, further comprising:
reconfiguring, by the memory controller, the appearance frequency rank information of the encoding table (ET),
wherein the reconfiguring of the appearance frequency rank information of the encoding table (ET) includes:
increasing an appearance frequency rank of a recently translated plain code to the top in the encoding table (ET).

8. The data scrambling method according to claim 1, wherein in the calculating of the adjustment rank, the plain code is divided into a plurality of sub-plain-codes and an adjustment rank corresponding to each of the plurality of sub-plain-codes is calculated using an encoding table (ET) corresponding to each of the plurality of sub-plain-codes and the random number,
in the determining of the cipher code, a plurality of sub-cipher-codes corresponding to appearance frequency ranks of the plurality of sub-plain-codes is determined using the respective adjustment rank corresponding to each of the plurality of sub-plain-codes and the ECC table including information of the sub-cipher-codes corresponding to the appearance frequency ranks of the plurality of sub-plain-codes and the plurality of sub-cipher-codes is combined to determine the cipher code, and
the calculating of the adjustment rank and the determining of the cipher code operate in parallel for the plurality of sub-plain-codes.

9. The data scrambling method according to claim 1, wherein when a programming distance (PD) is defined by an objective function which digitizes the closeness to a target for each of the cipher codes in accordance with a predetermined criterion, the ECC table matches each cipher code with the adjustment rank induced from the appearance frequency of each of the plain codes.

10. A data descrambling method performed by the memory controller coupled to the non-volatile memory device and performed on data scrambled in accordance with the data scrambling method according to claim 1, the method comprising:
receiving, by the memory controller, a read address from which a plain code is read;
reading, by the memory controller, a cipher code from the read address;
calculating, by the memory controller, a rank corresponding to the cipher code, using a decoding table (DT) including appearance frequency rank information of plain codes respectively corresponding to cipher codes, using a random number to calculate an adjustment rank; and
acquiring, by the memory controller, the plain code from a decoding cipher code (DCC) table including information of a respective plain code corresponding to a respective appearance frequency rank of the respective plain code.

* * * * *